United States Patent
Nguyen et al.

(10) Patent No.: US 12,395,130 B2
(45) Date of Patent: Aug. 19, 2025

(54) VARIABLE GAIN OPTICAL MODULATOR WITH OPEN COLLECTOR DRIVER AMPLIFIER AND METHOD OF OPERATION

(71) Applicant: MACOM Technology Solutions Holdings, Inc., Lowell, MA (US)

(72) Inventors: Nguyen Nguyen, Lowell, MA (US); Duy Nguyen, Lowell, MA (US); Trong Phan, Lowell, MA (US); Thanh Pham, Lowell, MA (US); Wayne Kennan, Lowell, MA (US); Stefano D'Agostino, Los Altos, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 251 days.

(21) Appl. No.: 18/089,484

(22) Filed: Dec. 27, 2022

(65) Prior Publication Data

US 2024/0213929 A1    Jun. 27, 2024

(51) Int. Cl.
*H03F 3/60* (2006.01)
*H03F 1/42* (2006.01)
*H03G 3/30* (2006.01)

(52) U.S. Cl.
CPC .............. *H03F 1/42* (2013.01); *H03F 3/605* (2013.01); *H03G 3/30* (2013.01); *H03F 2200/36* (2013.01); *H03G 2201/103* (2013.01)

(58) Field of Classification Search
CPC ........ H03F 1/42; H03F 3/605; H03F 2200/36; H03F 1/22; H03F 3/602; H03F 3/607;
(Continued)

(56) References Cited

U.S. PATENT DOCUMENTS

| | | |
|---|---|---|
| 4,488,305 A | 12/1984 | Claverie |
| 4,534,064 A | 8/1985 | Giacometti et al. |

(Continued)

FOREIGN PATENT DOCUMENTS

| | | |
|---|---|---|
| EP | 0606161 | 4/2000 |
| EP | 1471671 | 12/2004 |

(Continued)

OTHER PUBLICATIONS

Abhijit Phanse, National Semiconductor, "Exercise 2: Define the time variance of a fiber optic channel's Impulse Response, and suggest a method for measuring it", IEEE 802.3ae, Nov. 2000, 13 pages.

(Continued)

*Primary Examiner* — Khanh V Nguyen
(74) *Attorney, Agent, or Firm* — Jason H. Vick; Amped IP LLC

(57) ABSTRACT

A distributed amplifier system comprising an impedance matching network configured to match an input impedance to an output impedance of the signal source, and a DC block configured to block DC components in the input signal. A variable gain amplifier adjusts the gain applied to the input signal based on a gain control signal to generate a gain adjusted signal. An emitter follower circuit receives and processes the gain adjusted signal to introduce gain peaking to create a modified signal. A distributed amplifier receives and amplifies the modified signal from the emitter follower circuit, to create an amplified signal. The distributed amplifier includes a termination network and one or more impedance matching elements configured for gain shaping the amplified signal. The gain peaking introduced by the emitter follower circuit is controlled by a variable current source. The distributed amplifier may be an open collector distributed amplifier.

20 Claims, 14 Drawing Sheets

(58) Field of Classification Search
CPC ......... H03F 3/60; H03F 3/45183; H03G 3/30;
H03G 2201/103; H03G 1/0023; H03G
1/0088; H03G 3/45098; H03G 3/3042
USPC .......................................... 330/254, 278, 286
See application file for complete search history.

(56) References Cited

U.S. PATENT DOCUMENTS

| | | |
|---|---|---|
| 4,545,078 A | 10/1985 | Wiedeburg |
| 4,687,937 A | 8/1987 | Aagano et al. |
| 4,709,416 A | 11/1987 | Patterson |
| 4,734,914 A | 3/1988 | Yoshikawa |
| 4,747,091 A | 5/1988 | Doi |
| 4,864,649 A | 9/1989 | Tajima et al. |
| 5,019,769 A | 5/1991 | Levinson |
| 5,039,194 A | 8/1991 | Block et al. |
| 5,057,932 A | 10/1991 | Lang |
| 5,334,826 A | 8/1994 | Sato et al. |
| 5,383,046 A | 1/1995 | Tomofuji et al. |
| 5,383,208 A | 1/1995 | Queniat et al. |
| 5,392,273 A | 2/1995 | Masaki et al. |
| 5,394,416 A | 2/1995 | Ries |
| 5,396,059 A | 3/1995 | Yeates |
| 5,448,629 A | 9/1995 | Bosch et al. |
| 5,471,501 A | 11/1995 | Parr et al. |
| 5,488,627 A | 1/1996 | Hardin et al. |
| 5,491,548 A | 2/1996 | Bell et al. |
| 5,510,924 A | 4/1996 | Terui et al. |
| 5,532,471 A | 7/1996 | Khorramabadi et al. |
| 5,557,437 A | 9/1996 | Sakai et al. |
| 5,574,435 A | 11/1996 | Mochizuki et al. |
| 5,594,748 A | 1/1997 | Jabr |
| 5,636,254 A | 6/1997 | Hase et al. |
| 5,673,282 A | 9/1997 | Wurst |
| 5,710,660 A | 1/1998 | Yamamoto et al. |
| 5,812,572 A | 9/1998 | King et al. |
| 5,822,099 A | 10/1998 | Takamatsu |
| 5,831,959 A | 11/1998 | Sakanushi |
| 5,844,928 A | 12/1998 | Shastri et al. |
| 5,892,220 A | 4/1999 | Woodward |
| 5,900,959 A | 5/1999 | Noda et al. |
| 5,912,694 A | 6/1999 | Miyake |
| 5,926,303 A | 7/1999 | Giebel et al. |
| 5,943,152 A | 8/1999 | Mizrahi et al. |
| 5,953,690 A | 9/1999 | Lemon et al. |
| 5,956,168 A | 9/1999 | Levinson et al. |
| 5,978,393 A | 11/1999 | Feldman et al. |
| 6,005,240 A | 12/1999 | Krishnamoorthy |
| 6,010,538 A | 1/2000 | Sun et al. |
| 6,014,241 A | 1/2000 | Winter et al. |
| 6,020,593 A | 2/2000 | Chow et al. |
| 6,021,947 A | 2/2000 | Swartz |
| 6,023,147 A | 2/2000 | Cargin, Jr. et al. |
| 6,049,413 A | 4/2000 | Taylor et al. |
| 6,064,501 A | 5/2000 | Roberts et al. |
| 6,081,362 A | 6/2000 | Hatakeyama et al. |
| 6,108,113 A | 8/2000 | Fee |
| 6,111,687 A | 8/2000 | Tammela |
| 6,115,113 A | 9/2000 | Flockencier |
| H1881 H | 10/2000 | Davis et al. |
| 6,160,647 A | 12/2000 | Gilliland et al. |
| 6,175,434 B1 | 1/2001 | Feng |
| 6,259,293 B1 | 7/2001 | Hayase et al. |
| 6,262,781 B1 | 7/2001 | Deter |
| 6,282,017 B1 | 8/2001 | Kinoshita |
| 6,292,497 B1 | 9/2001 | Nakano |
| 6,333,895 B1 | 12/2001 | Hamamoto et al. |
| 6,366,373 B1 | 4/2002 | MacKinnon et al. |
| 6,397,090 B1 | 5/2002 | Cho |
| 6,423,963 B1 | 7/2002 | Wu |
| 6,452,719 B2 | 9/2002 | Kinoshita |
| 6,473,224 B2 | 10/2002 | Dugan et al. |
| 6,494,370 B1 | 12/2002 | Sanchez |
| 6,504,857 B1 | 1/2003 | Iwazaki |
| 6,512,617 B1 | 1/2003 | Tanji et al. |
| 6,535,187 B1 | 3/2003 | Wood |
| 6,556,601 B2 | 4/2003 | Nagata |
| 6,563,848 B1 | 5/2003 | Iwazaki |
| 6,570,944 B2 | 5/2003 | Best et al. |
| 6,580,328 B2 | 6/2003 | Tan et al. |
| 6,597,485 B1 | 7/2003 | Ikeuchi |
| 6,657,488 B1 | 12/2003 | King et al. |
| 6,661,940 B2 | 12/2003 | Kim |
| 6,704,008 B2 | 3/2004 | Naito et al. |
| 6,707,600 B1 | 3/2004 | Dijaili et al. |
| 6,720,826 B2 | 4/2004 | Yoon |
| 6,740,864 B1 | 5/2004 | Dries |
| 6,801,555 B1 | 10/2004 | DiJaili et al. |
| 6,828,857 B2 | 12/2004 | Paillet et al. |
| 6,836,493 B2 | 12/2004 | Mahowald et al. |
| 6,837,625 B2 | 1/2005 | Schott et al. |
| 6,852,966 B1 | 2/2005 | Douma et al. |
| 6,862,047 B2 | 3/2005 | Hibi |
| 6,864,751 B1 | 3/2005 | Schmidt et al. |
| 6,868,104 B2 | 3/2005 | Stewart et al. |
| 6,879,217 B2 | 4/2005 | Visocchi |
| 6,888,123 B2 | 5/2005 | Douma et al. |
| 6,909,731 B2 | 6/2005 | Lu |
| 6,934,307 B2 | 8/2005 | DeCustatis et al. |
| 6,934,479 B2 | 8/2005 | Sakamoto et al. |
| 6,941,077 B2 | 9/2005 | Aronson et al. |
| 6,952,531 B2 | 10/2005 | Aronson et al. |
| 6,956,643 B2 | 10/2005 | Farr et al. |
| 6,957,021 B2 | 10/2005 | Aronson et al. |
| 6,967,320 B2 | 11/2005 | Chieng et al. |
| 7,005,901 B1 | 2/2006 | Jiang et al. |
| 7,031,574 B2 | 4/2006 | Huang et al. |
| 7,039,082 B2 | 5/2006 | Stewart et al. |
| 7,046,721 B2 | 5/2006 | Grohn |
| 7,049,759 B2 | 5/2006 | Roach |
| 7,050,720 B2 | 5/2006 | Aronson et al. |
| 7,058,310 B2 | 6/2006 | Aronson et al. |
| 7,065,114 B2 | 6/2006 | Hishiyama |
| 7,066,746 B1 | 6/2006 | Togami et al. |
| 7,079,775 B2 | 7/2006 | Aronson et al. |
| 7,106,769 B2 | 9/2006 | Fairgrieve |
| 7,127,391 B2 | 10/2006 | Chang et al. |
| 7,181,100 B2 | 2/2007 | Douma et al. |
| 7,184,671 B2 | 2/2007 | Wang |
| 7,193,957 B2 | 3/2007 | Masui et al. |
| 7,206,023 B2 | 4/2007 | Belliveau |
| 7,215,891 B1 | 5/2007 | Chiang et al. |
| 7,233,206 B2 | 6/2007 | Murakami et al. |
| 7,265,334 B2 | 9/2007 | Draper et al. |
| 7,276,682 B2 | 10/2007 | Draper et al. |
| 7,357,513 B2 | 4/2008 | Watson et al. |
| 7,381,935 B2 | 6/2008 | Sada et al. |
| 7,400,662 B2 | 7/2008 | Robinson |
| 7,403,064 B2 | 7/2008 | Chou et al. |
| 7,453,475 B2 | 11/2008 | Nitta et al. |
| 7,502,400 B2 | 3/2009 | Preisach |
| 7,504,610 B2 | 3/2009 | Draper |
| 7,741,908 B2 | 6/2010 | Furuta |
| 7,778,294 B2 | 8/2010 | Nishimura et al. |
| 8,094,692 B2 | 1/2012 | Nakamura |
| 8,548,336 B2 | 10/2013 | Nuttgens |
| 8,571,079 B1 | 10/2013 | Nguyen |
| 8,872,487 B2 | 10/2014 | Belloni |
| 9,419,410 B2 | 8/2016 | Usuki |
| 11,245,366 B2 * | 2/2022 | Wu .............. H03F 3/45273 |
| 2001/0046243 A1 | 11/2001 | Schie |
| 2002/0015305 A1 | 2/2002 | Bornhorst et al. |
| 2002/0064193 A1 | 5/2002 | Diaz |
| 2002/0085600 A1 | 7/2002 | Jung |
| 2002/0105982 A1 | 8/2002 | Chin et al. |
| 2002/0130977 A1 | 9/2002 | Hibi |
| 2002/0140378 A1 | 10/2002 | Volk et al. |
| 2002/0181533 A1 | 12/2002 | Vail |
| 2003/0030756 A1 | 2/2003 | Kane et al. |
| 2003/0043869 A1 | 3/2003 | Vaughan |
| 2003/0053003 A1 | 3/2003 | Nishi et al. |
| 2003/0067662 A1 | 4/2003 | Brewer et al. |
| 2003/0122057 A1 | 7/2003 | Han et al. |
| 2004/0032890 A1 | 2/2004 | Murata |

(56) References Cited

U.S. PATENT DOCUMENTS

| | | |
|---|---|---|
| 2004/0047635 A1 | 3/2004 | Aronson et al. |
| 2004/0095976 A1 | 5/2004 | Bowler et al. |
| 2004/0114650 A1 | 6/2004 | Tanaka |
| 2004/0136727 A1 | 7/2004 | Androni et al. |
| 2004/0160996 A1 | 8/2004 | Giorgi |
| 2004/0202215 A1 | 10/2004 | Fairgrieve |
| 2004/0240041 A1 | 12/2004 | Tian et al. |
| 2004/0258115 A1 | 12/2004 | Murata |
| 2005/0024142 A1 | 2/2005 | Sowlati |
| 2005/0062530 A1 | 3/2005 | Bardsley et al. |
| 2005/0105574 A1 | 5/2005 | Wu |
| 2005/0141576 A1 | 6/2005 | Ikeda |
| 2005/0168319 A1 | 8/2005 | Bhattacharya et al. |
| 2005/0180280 A1 | 8/2005 | Hoshino et al. |
| 2005/0185149 A1 | 8/2005 | Lurkens et al. |
| 2005/0215090 A1 | 9/2005 | Harwood |
| 2005/0243879 A1 | 11/2005 | Horiuchi |
| 2006/0114954 A1 | 6/2006 | Wong et al. |
| 2006/0125557 A1 | 6/2006 | Manstretta |
| 2006/0192899 A1 | 8/2006 | Ogita |
| 2006/0239308 A1 | 10/2006 | Husain |
| 2006/0261893 A1 | 11/2006 | Chiang et al. |
| 2006/0278813 A1 | 12/2006 | Iesaka |
| 2006/0280211 A1 | 12/2006 | Garez |
| 2007/0047602 A1 | 3/2007 | Tanaka |
| 2007/0058089 A1 | 3/2007 | Wang |
| 2007/0081130 A1 | 4/2007 | May et al. |
| 2007/0098026 A1 | 5/2007 | Uesaka et al. |
| 2007/0159434 A1 | 7/2007 | Yen et al. |
| 2007/0195208 A1 | 8/2007 | Miyazawa et al. |
| 2007/0229718 A1 | 10/2007 | Hall |
| 2007/0263685 A1 | 11/2007 | Takasou |
| 2007/0286609 A1 | 12/2007 | Ikram et al. |
| 2008/0012508 A1 | 1/2008 | Steele et al. |
| 2008/0024469 A1 | 1/2008 | Damera-Venkata et al. |
| 2008/0055005 A1 | 3/2008 | Nam et al. |
| 2008/0074562 A1 | 3/2008 | Endo et al. |
| 2008/0231209 A1 | 9/2008 | Shiwaya et al. |
| 2008/0246893 A1 | 10/2008 | Boss et al. |
| 2008/0303499 A1 | 12/2008 | Chen et al. |
| 2008/0309407 A1 | 12/2008 | Nakamura et al. |
| 2009/0110409 A1 | 4/2009 | Zou et al. |
| 2009/0148094 A1 | 6/2009 | Kucharski et al. |
| 2009/0238226 A1 | 9/2009 | Moto |
| 2010/0164396 A1 | 7/2010 | Lindeberg et al. |
| 2010/0172384 A1 | 7/2010 | Groepl |
| 2010/0183318 A1 | 7/2010 | Tanaka |
| 2011/0062874 A1 | 3/2011 | Knapp |
| 2013/0070796 A1 | 3/2013 | Belloni |
| 2013/0229699 A1* | 9/2013 | Tatsumi .......... H03F 3/605 327/108 |
| 2014/0023374 A1 | 1/2014 | Yuda |
| 2014/0063593 A1 | 3/2014 | Berendt |
| 2014/0226147 A1 | 8/2014 | Metzler |
| 2014/0233594 A1 | 8/2014 | Kubo |
| 2014/0320212 A1 | 10/2014 | Kalantari et al. |
| 2015/0263625 A1 | 9/2015 | Kanezawa |
| 2016/0070123 A1* | 3/2016 | Tatsumi .......... G02F 1/0121 359/276 |
| 2016/0072462 A1 | 3/2016 | Itabashi et al. |
| 2016/0134081 A1 | 5/2016 | Louderback |
| 2017/0085057 A1 | 3/2017 | Barnes |

FOREIGN PATENT DOCUMENTS

| | | |
|---|---|---|
| JP | 5-152660 | 6/1993 |
| JP | 2004-045989 | 2/2004 |
| JP | 2001-119250 | 4/2015 |
| WO | WO 93/21706 | 10/1993 |
| WO | WO 02/063800 | 8/2002 |
| WO | WO 2004/098100 | 11/2004 |

OTHER PUBLICATIONS

"PLL Design", http://members.innet.net.au/☐richardh/PPH.htm, 9 pages.

Garth Nash, "AN535 Application Notes—Phase-Locked Loop Design Fundamentals", Motorola, Inc., 1994, 3 pages.

A Low Noise, Wide Dynamic Range, Transimpedance Amplifier with Automatic Gain Control for SDH/SONET (STM16/OC48) in a 30GHz ft BiCMOS Process, Mihai A. T., Sanduleanu, Philips Research Eindhoven, Paul Manteman, Philips Semiconductors Nijmegen, date unknown.

Analog Devices, Background information about wireless communications. http://rf.rfglobalnet.com/library/applicationnotes/files/7/bginfo.htm, Date unknown.

"LCT3454-1A Synchronous Buck-Boost High Current LED Driver" Linear Technology, http://www.linear.com/product/LTC3454 @Linear Technology, 12 pages.

Jamie Bailey "How DVD Works", http://sweb.uky.edu/~jrbai101/dvd.htm, May 1, 1999, pages.

Tuan "Solace" Nguyen, "CD, CD-R, CD-RW, DVD, DD-RAM, DVD-RW, and MO", Tweak3D.Net-Your Freakin' Tweakin Source!, http://www.tweak3d.net/articles/opticals/, May 13, 2000, 7 pages.

"An Introduction to DVD-RW", DVD White Paper, Pioneer New Media Technologies, Inc., Feb. 8, 2001, 8 pages.

Richard Wilkinson "Topic: Selecting the Right DVD Mastering Technique", DVD Technology Update, http://www.optical-disc.com/dvdupdate.html, 2002, 8 pages.

Dr. John Rilum, "Mastering Beyond DVD Density", http://www.optical-disc.com/beyonddvd.html, 2002, 7 pages.

"CD Basics: The Bumps", Howstuffworks "How CD Burners Work", http://entertainment.howstuffworks.com/cd-burner1.htm, 2004, 3 pages.

Keith Szolusha, "Linear Technology Design Notes DC/DC Converter Drives Lumileds White LEDs from a Variety of Power Sources-Design Note 340", Linear Technology Corporation, Linear Technology Corporation 2004, date unknown, 2 pages.

"An Introduction to DVD Recordable (DVD-R) What is DVD Recordable?" http://www.dvd-copy.com/reference/dvd_recordable.html, 2004, 8 pages.

"Power Management, LED—driver considerations" Analog and Mixed-Signal Products, Analog Applications Journal, www.ti.com/sc/analogapps, Texas Instruments Incorporated, © 2005 Texas Instruments Incorporated, Michael Day, 5 pages.

"Linear Technology LCT 3533 2A Wide Input Voltage Synchronous Buck-Boost DC/DC Converter", © Linear Technology Corporation 2007, 16 pages.

"National Semiconductor LM 3549 High Power Sequential LED Driver", © 2010 National Semiconductor Corporation, www.national.com, Aug. 3, 2010, 20 pages.

"TPS63020 TPS63021 High Efficiency Single Inductor Buck-Boost Converter With 4-A Switches", Texas Instruments, Copyright © 2010, Texas Instruments Incorporated, Apr. 2010, 28 pages.

"LT3476—High Current Quad Output LED Driver" Linear Technology, http://www.linear.com/product/LT3476, @2010 Linear Technology, 14 pages.

"Current mirror" Wikipedia, the free encyclopedia, http://en.wikipedia.org/wiki/Current_mirror, May 22, 2011, 8 pages.

"Mosfet" Wikipedia, the free encyclopedia, http://en.wikipedia.org/wiki/MOSFET, May 27, 2011, 24 pages.

Kim, "Dual Output Transimpedance Amplifier of Cost Effective CMOS Optical Receiver for Digital Audio Interfaces" Circuits and Systems, 2007. ISCAS 2007. IEEE International Symposyum.

P.M. Crespo Bofil, G. Shing Liu, C. Ho Wei. Combine baud-rate timing recovery and adaptive equalization for high rate data transmission in digital subscriber lines. In Comunicaciones de Telefonica y Desarrollo, vol. 41, No. 7, Jun. 1993. http://www.tid.es/presencia/publicaciones/comsid/esp/articulos/vol41/combi/combi.html.

Lukas, et al., "a Dimmable LED Driver with Resistive DAC Feedback Control for Adaptive Voltage Regularion", IEEE Transactions on Industry Applications, IEEE Service Center, vol. 51, No. 4, Jul. 1, 2015, pp. 3254-3262, XP011663155, ISSN: 0093-9994, doi: 10.1109/tia.2014.2387486.

Kamran Entesary, et al., "CMOS Distributed Amplifiers with Extended Flat Bandwidth and Improved Input Matching Using Gage Line

(56) References Cited

OTHER PUBLICATIONS with Coupled Inductors" IEEE Transactions on Microwave Theory and Techniques, vol. 57, No. 12, Dec. 2009, 10 pages.
Gholamreza Nikandish, et al., "The (R)evolution of Distributed Amplifiers" IEE Microwave Magazine, 1527-3342/18© 2018IEEE, Jun. 2018, 6 pages.
Bertrand, Ron "The Basics of PLL Frequency Synthesis" Online Radio & Electronics Course; Apr. 2002.

* cited by examiner

VARIABLE GAIN OPTICAL MODULATOR WITH OPEN COLLECTOR DRIVER AMPLIFIER AND METHOD OF OPERATION

1. FIELD OF THE INVENTION

The innovation relates to driver circuits and in particular a distributed amplifier with associated circuitry.

2. RELATED ART

Signal drivers may be used in numerous different types of systems such as, but not limited to, wireline communication systems, wireless communication systems, and optical systems, such as systems that utilize fiber optic cable as a signal medium. In numerous different environments of use, a signal must be driven or amplified as part of the transmit process.

A distributed driver architecture is chosen to address bandwidth and return-loss limitations of an equivalent traditional lumped driver approach. A block diagram illustrating the differences between the lumped and distributed driver is shown in FIG. 1.

Most prior art distributed amplifiers include a pair of transmission lines with characteristic impedances of $Z_0$ which connect the inputs and outputs of the amplifiers. An input signal is provided to the input path of the first device. As the input signal propagates down the input path, the signal is amplified, and the amplified output signal provided on the output path. The combination of FET capacitance with the high-impedance connection lines (input and output paths) resembles a lumped-element version of a fifty-ohm line.

The bandwidth of the lumped driver, if only a single stage, is dictated by the termination resistance and the loading capacitance from the lumped stages. The loading capacitance can be quite substantial because of the large current required in the stage, which dictates the use of large transistor devices. This large capacitance, from the driver stage devices and the associated routing parasitics, will limit the bandwidth. Hence, the benefit of moving to a distributed approach is that the parasitic capacitance loading is now reduced or spread over the chosen number of stages. An example 4-stage distributed driver architecture is shown in FIGS. 1 and 2, which are described below. The number of stages is chosen to meet gain, bandwidth, power, and complexity concerns. For this example, each of the four distributed stages would carry a quarter of the load current in the equivalent lumped stage.

The distributed driver incorporates artificial input and output inductor-capacitor (LC) transmission lines. The transmission line L and C components are chosen to meet both impedance and delay requirements, thereby minimizing reflections from impedance mismatch, and ensuring in-phase addition of the distributed output stages. The impedance requirement is defined in equation (1) and the delay is defined in equation (2). The L and C product, shown in equation (3), must also be chosen small enough so that the line approximates ideal behavior over the desired bandwidth.

$$Z = (L/C)^{1/2} \quad (1)$$

$$Tau = (L*C)^{1/2} \quad (2)$$

$$\text{Cutoff Frequency} = 1/(\pi*(L*C)^{1/2}) \quad (3)$$

FIG. 1 illustrates a block diagram of an exemplary prior art distributed amplifier. A singled ended arrangement is shown. The laser or optical modulator driver 104 includes an input node 108 and an output node 112. The input node 108 receives an outgoing electrical signal to be transmitted as an optic signal. In one embodiment, the input node receives data for high-speed transmission over the optic fiber. The output node 112 connects to a conductor, such as a trace, that provides the output signal to an optic signal generator.

Connected to the input node 108 is an inductor 124A and a first amplifier cell 120A. A capacitance, shown as capacitor 132, 136, associated with each amplifier cell 120A, is parasitic capacitance and is part of the first gain stage. This capacitance is inherently part of the amplifier cell, and not a separate physical capacitor, although it may be implemented with a physical capacitor. This arrangement repeats through one or more additional gain stages 120B, 120C, 120D as shown. Four exemplary gain stages are shown in FIG. 1, but in other embodiments a greater or lesser number of gain stages may be implemented subject to the target bandwidth and/or gain of the amplifier.

As shown in FIG. 1, the input of a first gain cell 120A is connected to the input of a second gain cell 120B through a first inductor 124B or a transmission line, the input of the second gain cell 120B is connected to the input of a third gain cell 120C through a second inductor 124C or a transmission line and so on through the fourth gain cell 120D and inductor 124D. The inductors may be actual elements, or inductance that is part of or built into, the conductive path. The input of the last gain cell 120D is connected to a termination element 150 directly or through an inductor/transmission line 124E as shown. The termination element 150 can be a resistor.

The input node 108 of the first gain cell 120A is connected to the output of a pre-driver directly (as shown) or through an inductor/transmission line. The output of the first gain cell 120A is connected to the output of the second gain cell 120B through another inductor 148B or a transmission line, the output of the second gain cell 120B is connected to the output of the third gain cell 120C through another inductor 148C or a transmission line. The output of the third gain cell 120C is connected to the output of the fourth gain cell 120D through another inductor 148D or a transmission line. The output of the last gain cell 120D is connected to output node 112 directly (as shown) or through an inductor/transmission line. The output node 112 connects to the optic signal generator, such as a laser or an optical modulator. In other embodiments, a greater or fewer number of amplifier (gain) cells may be implemented.

The output of the first gain cell 120A is connected to a termination element 140 directly (as shown) and/or through an inductor/transmission line 148A. Termination resistors 140, 150 are associated with the first gain cell (amplifier stage) 120A output and the last gain cell (amplifier stage) 120D input. In other embodiments, additional resistors may be placed in the driver circuit. The resistors 140, 150 may be selected based on various design constraints and preferences such as power consumption, maximum operating frequency, input and output impedance, and the return losses. The resistance typically ranges from 20 ohms to 100 ohms but are driven and determined by system requirements. The signal propagates through the gain cells 120A, 120B, 120C, 120D towards the output node 112.

FIG. 2 illustrates an example embodiment of a distributed driver arranged in a differential pair configuration. In relation to FIG. 1, similar elements are labeled with identical reference numbers. Elements previously described are not described again. In this embodiment, the distributed amplifiers are configured as a differential pair. A pair of FET devices 370, 372 are arranged as shown with a current source 380 or path located below the FET device 370. Although shown as FET devices, it is contemplated and disclosed that the devices may be heterojunction bipolar transistor, (HBT), FET, bipolar junction transistor (BJT), junction field effect transistor (JFET) or any other type of device or process. Operation of this circuit configuration is known in the art and not described herein. Parasitic capacitance 332, 336 is also shown. More than one differential pair may be provided in each cell 320. Additional differential pairs 380B, 380C, 380D are also provided as shown.

Additional inductors 324A, 324B, 324C, 324D, 324E are provided and associated with the second leg of the differential pair along the input path at the bottom of FIG. 2. Additional inductors 348A, 348B, 348C, 348D, 348E are provided and associated with the second leg of the differential pair along the output path at the top of FIG. 2. Similarly, termination resistors 340, 350 are arranged as shown in the second leg of the differential pair. Resistor 340 is the termination resistor at the output, while resistor 350 is the termination resistor at the input. Operation and function are generally similar to the embodiment shown in FIG. 1, with the differential signal provided on input nodes 108 and 308. Output nodes 112 and 312 provide a differential signal to an optical modulator or a laser.

These prior art designs suffered from several drawbacks. One drawback is limited output swing and excessive power consumption for a given output signal magnitude. Some prior art amplifiers were also excessively large. For output circuits with large output swings to drive the downstream modulator requires a large device area for the output stages. Due to the sizeable device, capacitance is then also high, which reduces bandwidth, as discussed above. The resulting circuit creates parasitic capacitance issues and loading causing it to be too slow, thus limiting bandwidth.

SUMMARY

To overcome the drawbacks of the prior art and provide additional benefits, a distributed amplifier system is disclosed. In one embodiment, the distributed amplifier comprises an input configured to receive an input signal from a signal source and an impedance matching network configured to match an input impedance to an output impedance of the signal source. A DC block is provided and configured to block DC components in the input signal while a variable gain amplifier is configured to adjust the gain applied to the input signal based on a gain control signal to generate a gain adjusted signal. An emitter follower circuit is configured to receive and process the gain adjusted signal to introduce gain peaking to create a modified signal. A distributed amplifier is configured to receive the modified signal from the emitter follower circuit such that the distributed amplifier is configured to amplify the modified signal to create an amplified signal.

This system may further comprise an emitter follower stage located between the DC block and the variable gain amplifier. In one embodiment, the distributed amplifier is configured as an open collector distributed amplifier. The distributed amplifier may also include a termination network and one or more impedance matching elements in the input path which are configured to perform gain shaping in the amplified signal. It is contemplated that the distributed amplifier may include two or more amplifier cells configured as cascode differential pair circuits. It is also contemplated that the input signal to the distributed amplifier system may be a differential input signal. The gain peaking introduced by the emitter follower circuit may be controlled by a variable current source. The distributed amplifier system may be part of an optic signal transmitter.

Also disclosed is a method for processing and amplifying an input signal prior to transmission. In one embodiment, this method comprises impedance matching the input signal with an impedance matching network to reduce signal return loss, and then reducing or eliminating DC signal components in the input signal with a DC block circuit. Thereafter, adjusting the gain applied to the input signal with a variable gain amplifier to create a modified input signal. Processing of the modified input signal with an emitter follower circuit to establish gain peaking into the modified input signal. Then, receiving and amplifying the modified input signal with gain peaking with a distributed amplifier to create an amplified signal.

The distributed amplifier may be configured with an open collector. In addition, this method may further comprise performing impedance matching and gain peaking control with an emitter follower stage prior to adjusting the gain with the variable gain amplifier. In one embodiment, the DC block circuit comprises one or more capacitors. In addition, the amount of gain performed by the variable gain amplifier is based on a control signal provided to a variable current source. It is contemplated that the input signal may be a differential signal and the output signal may be a differential signal. In one configuration, the distributed amplifier includes two or more amplifier cells each configured as cascode differential pair circuits.

Also disclosed is an optic signal transmitter with distributed amplifier comprising an input configured to receive an input signal from a data source. A driver and biasing module is part of the transmitter and includes one or more biasing circuits configured to generate one or more bias signals for the transmitter, an impedance matching network configured to match an input impedance of the transmitter to an output impedance of the data source, a variable gain amplifier configured to adjust a magnitude of the input signal based on a gain control signal to generate a gain adjusted signal, an emitter follower circuit configured to receive and process the gain adjusted signal to introduce gain peaking, and a distributed amplifier configured to receive and amplify the gain adjusted signal with gain peaking, from the emitter follower circuit, to create an amplified signal. The modulator and optic signal generator are configured to receive the amplified signal and convert the amplified signal to a modulated optic signal for transmission over an optic channel.

The transmitter may further comprise a DC block connected to an output of the impedance matching network such that the DC block is configured to block DC components in the input signal. The distributed amplifier may be configured with an open collector. In one embodiment, the gain of the variable gain amplifier is based on a control signal provided to a variable current source. In one configuration, the distributed amplifier includes two or more amplifier cells each configured as cascode differential pair circuits.

To overcome the drawbacks of the prior art and provide additional benefits, disclosed is a distributed amplifier for an optic signal generator. In one embodiment, the distributed amplifier comprises two or more amplifier cells such that each amplifier cell has one or more emitter follower circuits having an emitter follower input and an emitter follower output configured to perform frequency specific gain adjustment. The cells also include two or more amplifiers comprising a cascode connected transistors configured to amplify the received signal to create an amplified signal. An amplifier cell output is provided and configured to carry the amplified signal from the amplifier cell. Also part of the distributed amplifier is an input path and an output path. The input path is configured to receive and distribute the input signal to the two or more amplifier cells. The input path includes one or more inductors that cancel parasitic capacitance from the two or more amplifier cells. The output path connects to the amplifier cell output of the two or more amplifier cells to receive the amplified signal. The output path includes one or more inductors that cancel parasitic capacitance from the two or more amplifier cells.

In one embodiment, an inductor from the input path and an inductor from the output path is associated with each amplifier cell. In one configuration, the combination of the amplifier parasitic capacitance and the inductors in the input path and the output path form a transmission line that tunes out the parasitic capacitance from the two or more amplifier cells. It is contemplated that the two or more amplifier cells may be configured in an open collector configuration. In one embodiment, the emitter follower circuit further comprises a variable current source configured to control the frequency specific gain adjustment. The distributed amplifier may further comprise a termination network and gain shaping network, connected to or part of the input path, which is configured to perform gain shaping. In one configuration, the amplifier cell input comprises a first input and a second input such that the first and second inputs are configured to accept a differential signal, and the first input connects to a first emitter follower circuit and the second input connects to a second emitter follower circuit.

Also disclosed is a method for amplifying, with a distributed amplifier, an input signal for use in an optic signal communication system. In one embodiment, this method comprises receiving the input signal such that the input signal to be transmitted on an optic fiber as an optic signal. Then, distributing the input signal to two or more emitter follower circuits over an input path having an inductance. The input path has an inductance that cancels a parasitic capacitance of the two or more amplifier cells. The two or more emitter follower circuits introduce frequency specific adjustment to the input signal for gain peaking, gain shaping, or both. Then, amplifying the input signal, after frequency specific adjustment, with two or more amplifier cells to generate amplified output signals. This method of operation combines the amplified output signals from the two or more amplifier cells on an output path as a combined output signal. The output path has an inductance that cancels a parasitic capacitance of the two or more amplifier cells. The combined output signal is presented on an output from the distributed amplifier such that the output connects to the output path.

In one embodiment, an inductor from the input path and an inductor from the output path is associated with each amplifier cell, and the inductors are realized as integrated transmission line elements. The combination of the amplifier parasitic capacitance and the inductors in the input path and the output path form a transmission line that tunes out the parasitic capacitance from the two or more amplifier cells. It is contemplated that the two or more amplifier cells may be configured in an open collector configuration. The emitter follower circuit may include a variable current source configured to control the frequency specific gain control. In addition, this method may further comprise providing a control signal to a variable current source that is part of the emitter follower circuit. The control signal determines the amount of frequency specific gain adjustment. In one embodiment, the two or more amplifier cells further comprise a first input and a second input, the first and second inputs are configured to accept a differential signal, and the first input connects to a first emitter follower circuit and the second input connects to a second emitter follower circuit.

Also disclosed is a distributed driver for an optic signal generator. The driver may comprise a driver input configured to receive an input signal and an output configured to provide an output signal to the optic signal generator or modulator. This embodiment also includes a first amplifier cell comprising a first amplifier cell input, one or more emitter follower circuits, one or more amplifiers, and a first amplifier cell output. The first amplifier cell is configured to receive and amplify the input signal to create a first amplified signal on the first amplifier cell output. A second amplifier cell is provided and comprises a second amplifier cell input, one or more emitter follower circuits, one or more amplifiers, and a second amplifier cell output. The second amplifier cell configured to receive and amplify the input signal to create a second amplified signal on the second amplifier cell output. A first conductive path is provided which connects the driver input to the first amplifier cell input and the second amplifier cell input. The first conductive path carries the input signal to the first amplifier cell and the second amplifier cell such that an inductance of the first conductive path counteracts a capacitance associated with the first and second amplifier cells. Also part of this embodiment is a second conductive path connecting the driver output to the first and second amplifier cell outputs. The second conductive path carries the first amplified signal and the second amplifier signal to the driver output, such that an inductance of the second conductive path counteracts the capacitance associated with the first amplifier cell and the second amplifier cell.

In one embodiment, the one or more amplifiers are configured as a cascode connected differential pair. In addition, the distributed driver may further comprise additional amplifiers cells having a configuration that is the same as the first and second amplifier cells. It is contemplated that the first and second amplifier cell may have an open collector configuration. The one or more emitter follower circuits may further comprise a variable current source configured to control a frequency specific gain adjustment. In addition, the distributed driver may further comprise a termination network and gain shaping network, connected to or part of the first conductive path, that is configured to perform frequency specific gain shaping.

To overcome the drawbacks of the prior art and provide additional advantages, a distributed amplifier with variable gain control stage is disclosed. In one embodiment, this distributed amplifier with variable gain control stage comprises a variable gain amplifier comprising a signal input configured to receive a data signal and a gain control input configured to receive a gain control signal. A gain controlled amplifier is configured to receive the data signal and the gain control signal to create a gain adjusted signal, such that an amount gain adjustment is determined by the gain control signal. Also part of this embodiment is one or more gain peaking control elements, connected to the gain controlled amplifier, that are configured to establish gain peaking in the gain adjusted signal. A variable gain control stage output is configured to provide the gain adjusted signal from the one or more gain peaking control elements to the distributed amplifier. Furthermore, two or more amplifier cells are provided such that each amplifier cell comprises an amplifier cell input configured to receive the gain adjusted signal, two or more amplifiers, connected in a cascode configuration, to amplify the gain adjusted signal to create an amplified signal, and an amplifier cell output configured to carry the amplified signal. Also provided are an input path and an output path. The input path receives the input signal and distributes the input signal to the two or more amplifier cells. The input path includes one or more inductors that cancel input parasitic capacitance from the two or more amplifier cells. The output path connects to the amplifier cell output of the two or more amplifier cells to receive the amplified signal. The output path including one or more inductors that cancel output parasitic capacitance from the two or more amplifier cells.

In one embodiment, the one or more gain peaking control elements comprise inductors. The distributed amplifier may further comprise one or more emitter follower circuits having an emitter follower input connected to the input path and an emitter follower output connected to the amplifier cell input. The one or more emitter follower circuits are configured to perform frequency specific gain adjustment in the amplified signal created by the one or more amplifier cells. In one configuration, an inductor from the input path and an inductor from the output path are associated with each amplifier cell. It is contemplated that the distributed driver may further comprise a degeneration network connected to the gain controlled amplifier such that the degeneration network is configured to adjust low frequency gain. The variable gain amplifier may further comprise one or more termination resistors configured to establish the gain of the gain controlled amplifier and set the output impedance of the variable gain amplifier. In one embodiment, the two or more amplifier cells are configured in an open collector configuration. The emitter follower circuit may further comprise a variable current source configured to control the frequency specific gain adjustment.

Also disclosed is a distributed amplifier with variable gain control comprising a gain control circuit that includes a gain control circuit input, a gain control circuit output, one or more gain control amplifiers, and one or more gain peaking control elements located between the variable gain amplifier and the output. An amount gain adjustment is determined by the gain control signal which is received on a gain control signal input of the gain control circuit which causes the gain control circuit to generate a gain adjusted signal. The distributed amplifier comprises an input path configured to receive and distribute the input signal to two or more amplifier cells. The input path includes one or more inductors that cancel input parasitic capacitance from the two or more amplifier cells. Two or more amplifier cells are provided and configured with amplifiers in a cascode configuration to amplify the received signal to create the amplified signal. An output path is connected to the amplifier cell output of the two or more amplifier cells to receive the amplified signal. The output path includes one or more inductors that cancel output parasitic capacitance from the two or more amplifier cells.

In one embodiment, the gain peaking control elements comprise inductors. The distributed amplifier may further comprise a termination load connected between the gain peaking control elements and the gain control circuit output. In one configuration, the distributed amplifier further comprises one or more emitter follower circuits, associated with each amplifier cell, that are located between the input path and the two or more amplifier cells, wherein the emitter follower circuits are configured to perform frequency specific gain adjustment in the amplified signal. It is contemplated that the emitter follower circuit may further comprise a variable current source configured to control the frequency specific gain adjustment. It is contemplated that the gain control circuit may further comprise a degeneration network connected to the gain control amplifier such that the degeneration network is configured to adjust low frequency gain. In one embodiment, the two or more amplifier cells are configured in an open collector configuration.

Also disclosed is a method for creating an amplified signal with frequency specific magnitude adjustment. In one embodiment, this method includes receiving the input signal, which is a signal to be transmitted on an optic fiber as an optic signal, and then adjusting gain applied to the input signal with a variable gain amplifier, based on a control gain signal. This creates a gain adjusted signal, such that adjusting the gain includes introducing frequency specific magnitude adjustment to the input signal for gain peaking, gain shaping, or both. Then, receiving the gain adjusted signal on an amplifier input path, the amplifier input path having an inductance that cancels input parasitic capacitance of two or more amplifier cells. The input signal is amplified after frequency specific magnitude adjustment with the two or more amplifier cells, and the amplified output signals from the two or more amplifier cells are combined on an output path as a combined output signal. The output path has an inductance that cancels output parasitic capacitance of the two or more amplifier cells. The combined output signal is then presented on an output.

In one embodiment, an inductor from the input path and an inductor from the output path are associated with each amplifier cell, and the inductors are realized as integrated transmission line elements. The two or more amplifier cells may be configured in an open collector configuration. It is contemplated that this method further includes introducing frequency specific gain control with an emitter follower circuit that is associated with at least one of the two or more amplifier cells, such that the emitter follower circuit including a variable current source configured to control an amount of frequency specific gain control. The two or more amplifier cells may further comprise a first input and a second input. The first and second inputs are configured to accept a differential signal, and the first input connects to a first emitter follower circuit and the second input connects to a second emitter follower circuit.

Also disclosed is a distributed driver for an optic signal generator comprising a driver input configured to receive an input signal and a driver output configured to provide an amplified output signal to the optic signal generator or modulator. Also disclosed is a first amplifier cell comprising a first amplifier cell input, one or more amplifiers, and a first amplifier cell output. The first amplifier cell is configured to receive and amplify the input signal to create a first amplified signal on the first amplifier cell output. A second amplifier cell comprises a second amplifier cell input, one or more amplifiers, and a second amplifier cell output. The second amplifier cell is configured to receive and amplify the input signal to create a second amplified signal on the second amplifier cell output. A first conductive path has a first end and a second end, and the first end is connected to the driver input. The first conductive path connects the driver input to the first and the second amplifier cell inputs, to thereby carry the input signal to the first and second amplifier cells. In addition, one or more inductances in the first conductive path counteracts a capacitance associated with the first amplifier cell and the second amplifier cell. A gain shaping termination network is connected to, or part of, the second end of the first conductive path and is configured to perform frequency specific gain shaping. A second conductive path is also provided such that the second conductive path connects the driver output to the first amplifier cell output and the second amplifier cell output, to thereby carry the amplified output signal created by the first amplifier cell and the second amplifier cell to the driver output. In addition, one or more inductances in the second conductive path counteracts a capacitance associated with the first amplifier cell and the second amplifier cell.

The one or more amplifiers may be configured as a cascode differential pair. The distributed driver may further comprise additional amplifier cells having the same configuration as the first and second amplifier cells. The distributed driver of claim 1 wherein the first and second amplifier cells have an open collector configuration. It is contemplated that the distributed driver may further comprise one or more emitter follower circuits connected between the first conductive path and the first amplifier cell input, and one or more emitter follower circuits connected between the first conductive path and the second amplifier cell input.

The emitter follower circuits may further comprise one or more variable current sources, within each emitter follower circuit, that are configured to control a frequency specific gain adjustment performed by the one or more emitter follower circuits. The gain shaping termination network may comprise one or more inductors and one or more resistors. In one embodiment, the gain shaping termination network comprises one or more inductors, one or more resistors, and one or more capacitors connected in series between a ground and an inductor in the input path.

Also disclosed is a method for amplifying, with a distributed amplifier, an input signal. In one configuration, this method comprises receiving the input signal on an input path, the input path having a first end and a second end, such that the first end receives the input signal, and the second end is terminated with a gain shaping termination network. The input path further comprises one or more inductors. This method also distributes the input signal to two or more amplifier cells through the input path that has one or more inductors and a termination network. The step of distributing includes introducing frequency specific gain shaping into the input signal with the gain shaping termination network, canceling parasitic capacitance associated with two or more amplifiers, in the distributed amplifier, with the one or more inductors, amplifying the input signal after frequency specific gain adjustment with the two or more amplifier cells to generate amplified output signals, combining the amplified output signals from the two or more amplifier cells on an output path as a combined output signal, the output path having one or more inductors that cancel output parasitic capacitance of the two or more amplifier cells, and presenting the combined output signal on an output from the distributed amplifier, the output connected to the output path.

In one embodiment, the gain shaping termination network consists of one or more resistors, one or more inductors and one or more capacitors, and the gain shaping termination network is located at an end of the input path that is opposite an end of the input path that receives the input signal. In one configuration, an inductor from the input path and an inductor from the output path is associated with each amplifier cell, and the inductors are realized as integrated transmission line elements. The gain shaping termination network may comprise series connected inductors, resistors, and capacitors, which connect to an inductor in the input path. In one embodiment, the two or more amplifier cells are configured in an open collector configuration. This method of operation may further comprise performing additional frequency specific gain adjustment with one or more emitter follower circuits in at least one of the two or more amplifier cells.

The distributed driver may further comprise providing a control signal to a variable current source that is part of the at least one emitter follower circuit, such that the control signal determines the amount of frequency specific gain adjustment introduced by the at least one emitter follower circuit. The distributed amplifier may be configured to accept and amplify a differential signal and the input signal is a differential signal.

Also disclosed is a distributed amplifier for an optic signal generator comprising two or more amplifier cells, each cell having two or more amplifiers that include cascode connected transistors, configured to amplify a received signal to then create an amplified signal, and an output port configured to carry the amplified signal. Also provided is an input path which has a first end and a second end. The input path is configured to receive the input signal at the first end and distribute the input signal to the two or more amplifier cells. The input path includes one or more inductors that cancel parasitic capacitance from the two or more amplifier cells. An output path connects to the amplifier cell output of the two or more amplifier cells to receive and output the amplified signal from two or more amplifier cells, the output path including one or more inductors that cancel parasitic capacitance from the two or more amplifier cells. Also part of this embodiment is a gain shaping network at the second end of the input path, the gain shaping network configured to introduce frequency specific gain shaping in the amplified signal from two or more amplifier cells.

An inductor from the input path and an inductor from the output path may be associated with each amplifier cell. In one embodiment, the gain shaping network comprises series connected inductors, resistors, and capacitors, which connect to an inductor in the input path. The distributed amplifier may be configured to amplify a differential signal, the input path comprises a first input path and a second input path, and the first input path and the second input path connect through one or more resistor at the second end.

Other systems, methods, features, and advantages of the invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 3A:
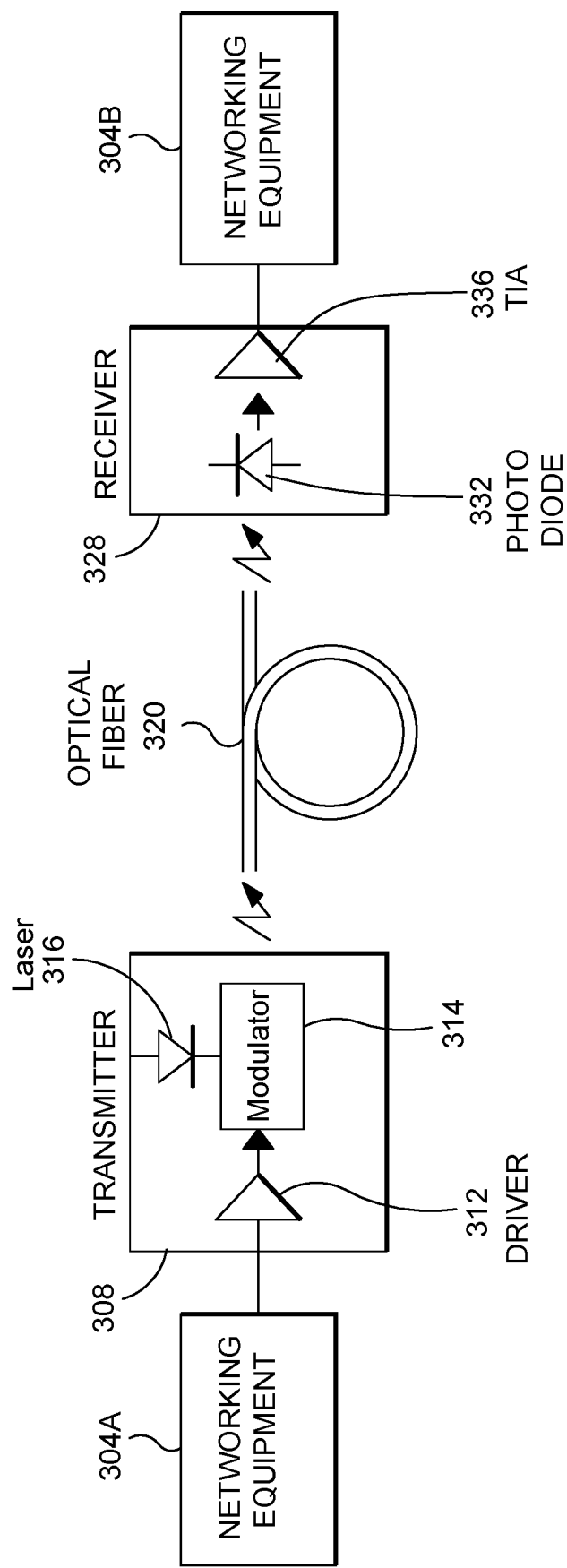
FIG. 3A illustrates an exemplary optic fiber communication link.

One example environment of use of the innovation disclosed herein is in an optical communication system that utilizes optical fiber links and lasers/LED or some other form of optic signal generator (light source). FIG. 3A illustrates an exemplary optic fiber communication link. To enable communication between remote networking equipment 304A, 304B, a fiber optic transmitter 308 and receiver 328 are provided. Driver amplifier 312, which is part of a transmitter 308, drives the modulator 314. The modulator 314 also receives an optic signal, from a laser 316 as shown. The output of the modulator 314 is a modulated optic signal which is coupled to the fiber 320 for signal transmission. Other embodiments may not include the modulator 314, such as direct drive system which connects the driver directly to the laser 316.

At the receiving side of the optical fiber link is a receiver 328. The receiver 328 includes a photodiode (photodetector) 332 and one or more amplifiers (although only one amplifier is shown to simplify FIG. 3A). The amplifier 336 may be a TIA or any other type of amplifier or amplifiers. As used herein, the term amplifier means one or more amplifiers. Optical energy is converted into an electrical signal by the photodiode 332 and processed further by the one or more amplifiers 336 to set the signal magnitude to a level suitable for further processing. It is contemplated that the innovation disclosed herein may be used in other environments of use than that shown in FIG. 3A and FIG. 3B.

Figure 3B:
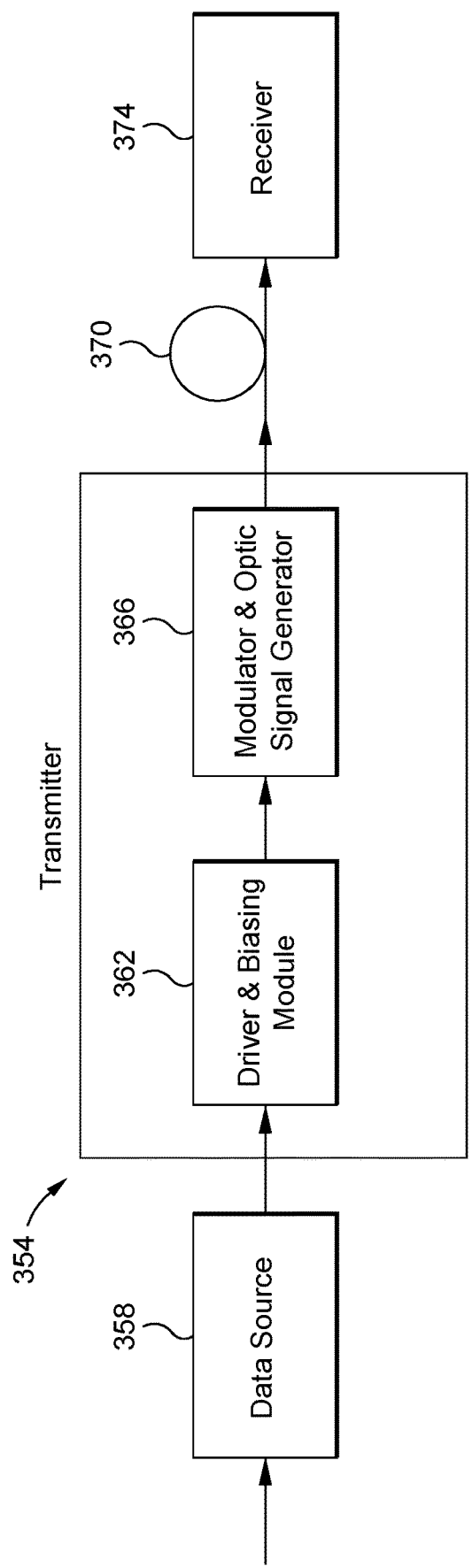
FIG. 3B illustrates an example environment of use of the distributed driver disclosed herein.

FIG. 3B illustrates an example environment of use of the distributed driver disclosed herein. This is but one possible embodiment, and it is contemplated and understood that the innovation disclosed herein may be used in other environments than disclosed below. As shown, an exemplary optic signal transmitter 354 includes a data source 358 that provides data for transmission as an optic signal. The data source 358 may be another system or device, either on chip or off chip, or a memory. The data source 358 provides the data to a driver and biasing module 362 that is part of the transmitter 354. The driver and biasing module 362 prepare the data for transmission to a level suitable for downstream processing. The output of the driver and biasing module 362 connects to a modulator and optic signal generator 366. The modulator and optic signal generator 366 are configured to generate a modulated optic signal for transmission over an optic channel 370. In other embodiment, wireline or wireless transmission may occur. In this embodiment, the driver and biasing module 362 is configured as a distributed driver, as described herein, with optional distributed biasing associated with each amplifier cell.

Optical signal generators that may be used with the driver disclosed herein are direct modulated lasers (DMLs), EMLs (Electroabsorptive Modulated Lasers), VCSELs (Vertical Cavity Surface Emitting Lasers), LEDs (Light Emitting diodes), PICs (photonic integrated circuits) and other optical modulators such as, but not limited to, Mach-Zehnder modulator or ring modulator. The generated optic signal is provided to a fiber optic cable 370, which carries the optic signal to a remotely located receiver 374.

Figure 4:
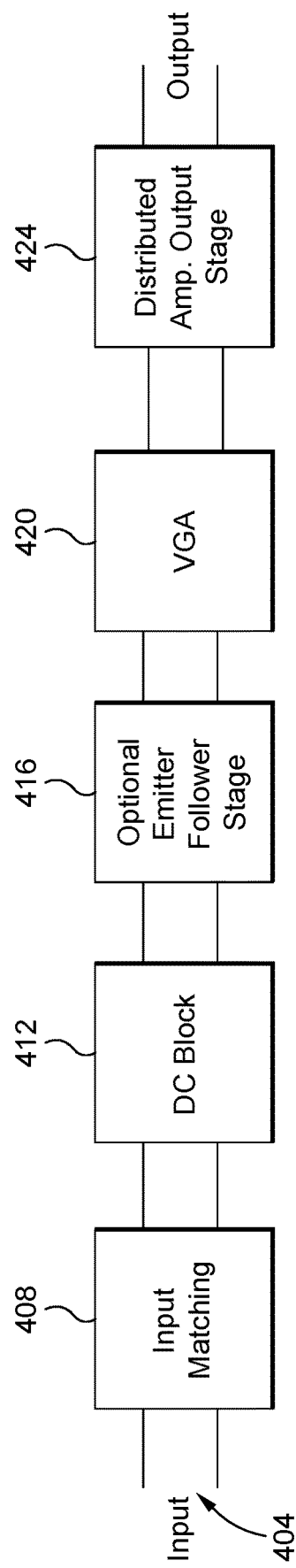
FIG. 4 illustrates a block diagram of an example embodiment of a distributed driver amplifier output stage with associated circuitry.

FIG. 4 illustrates a block diagram of an example embodiment of a distributed driver amplifier output stage with associated circuitry. This is but one possible example embodiment and other configurations are possible. In this embodiment differential inputs 404, carrying differential signals, connect to an input matching network 408. The input matching network 408 is configured to impedance match with an upstream source or stage to maximize power transfer by reducing unwanted reflections. The input matching network 408 may comprise an inductor-capacitor network with distributed elements, although in other embodiments other circuit arrangements may be used which may include resistor, capacitors, inductors, or any combination of passive or active elements. The input matching network 408 or the impedance matching elements of FIG. 5, may be configured in whole or in part as a transmission line with passive elements that change in size (length and/or width) based on position within the transmission line.

The output of the input matching network 408 connects to a DC blocking circuit 412. The DC blocking circuit 412 is configured to prevent unwanted DC signal components from subsequent stages. The DC blocking circuit 412 may comprise series connected capacitors or an RC network, although in other embodiments other circuit arrangements may be used.

The output of the DC blocking circuit 412 connects to an optional emitter follower stage 416. The optional emitter follower stage 416 is configured to transform the impedance between the DC block output and a subsequent element, such as VGA stage 420. The emitter follower stage 416 may comprise any type of emitter follower stage design, with one example being shown in FIG. 6. Other embodiments, other circuit arrangements may be used. The emitter follower stage 416 is also configured to provide peaking (gain) control. The emitter follower stage 416 should be considered optional and should not be confused with the emitter follower circuits that are part of the distributed amplifier 424.

Figure 10:
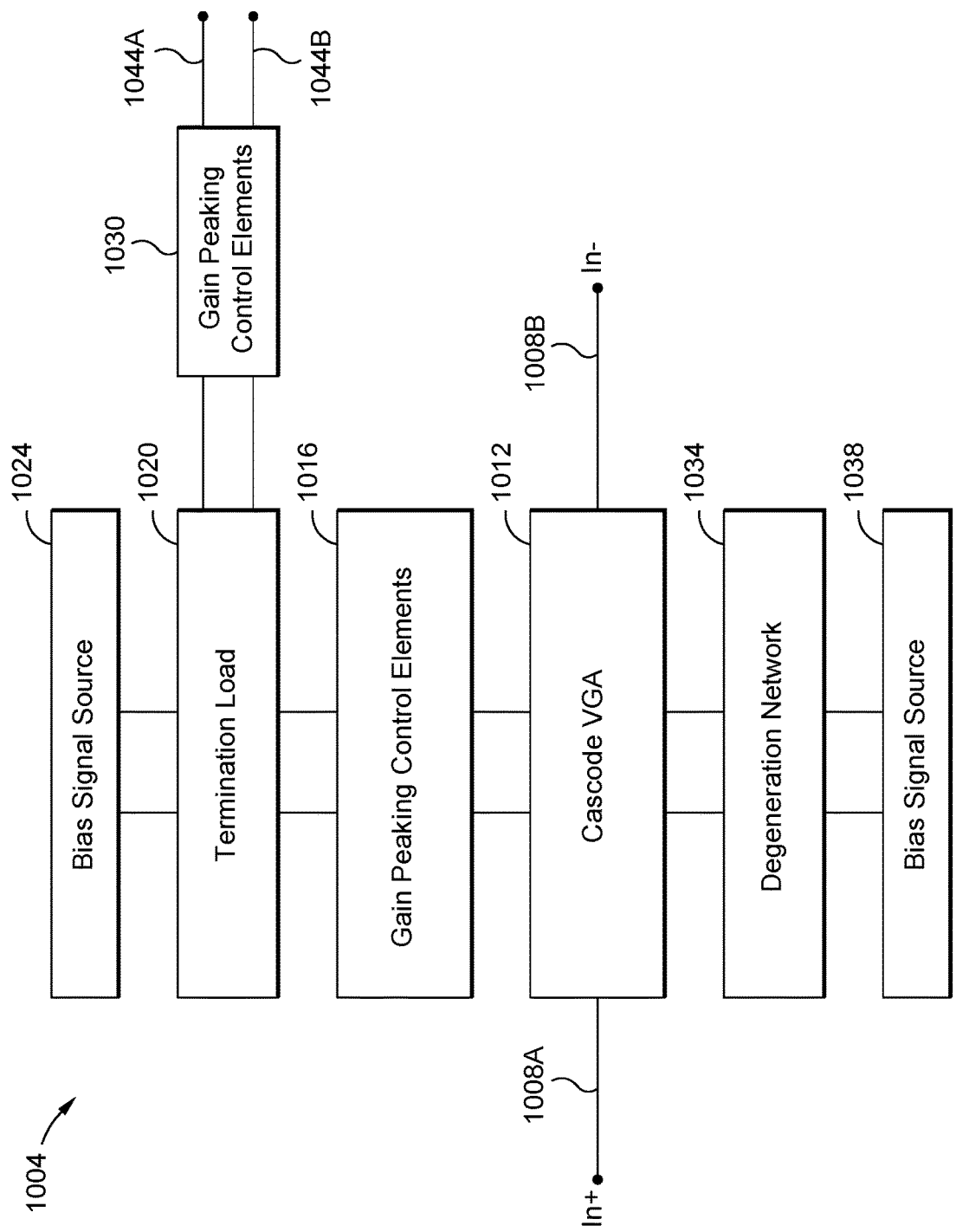
FIG. 10 illustrates a block diagram of an example embodiment of a variable gain amplifier (VGA).
Figure 11:
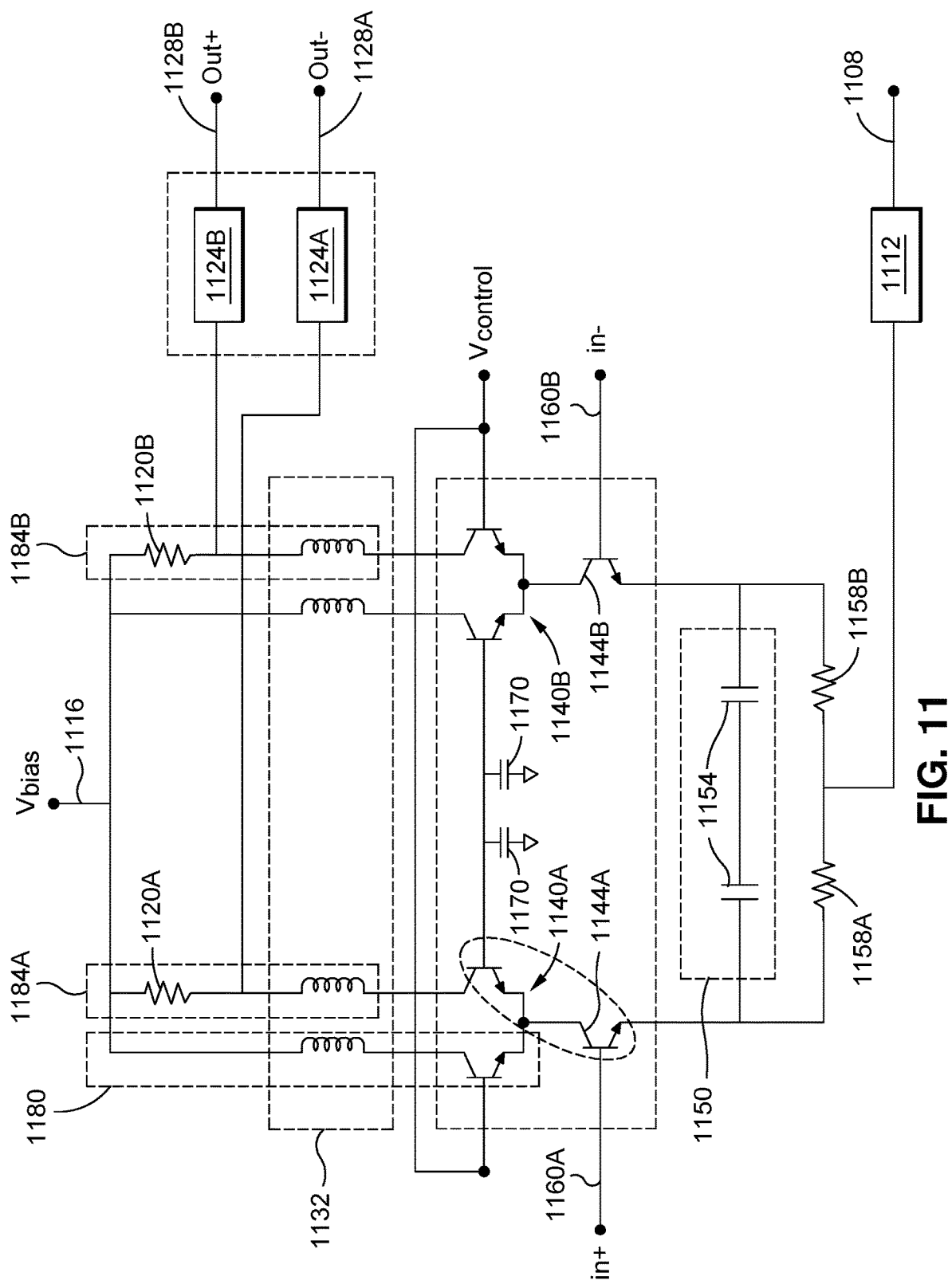
FIG. 11 illustrates a circuit diagram of an example embodiment of a variable gain amplifier (VGA).

The output of the emitter follower stage 416 connects to a variable gain amplifier (VGA) 420. The VGA 420 is configured to provide variable gain control to the system of FIG. 4. The VGA 420 may comprise any type of VGA design with one novel design as shown in FIG. 10 and FIG. 11, although in other embodiments other circuit arrangements may be used.

Figure 6:
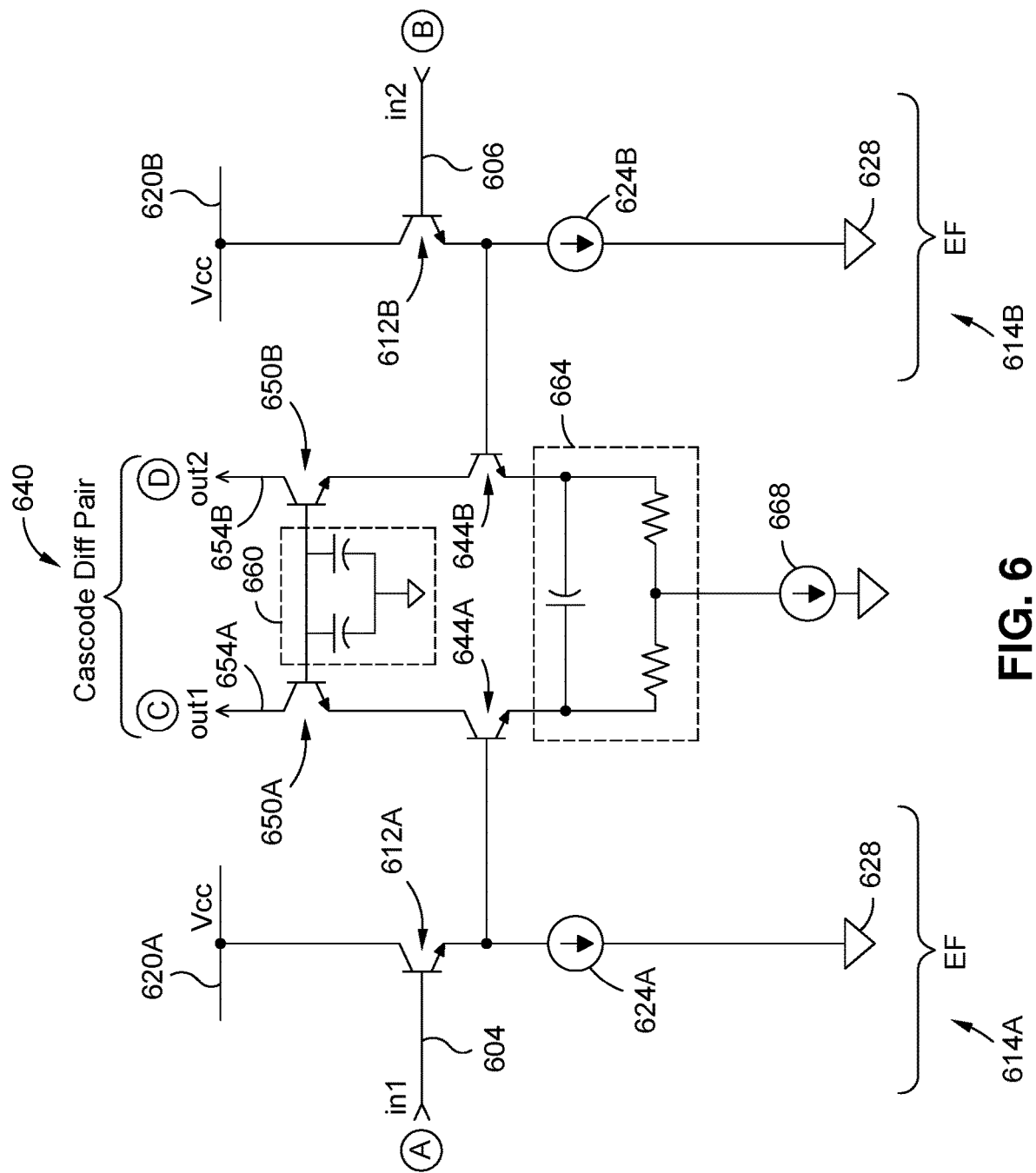
FIG. 6 illustrates an exemplary emitter follower (EF) stage and an exemplary cascode differential pair output stage.

The output of the VGA 420 connects to a distributed amplifier output stage 424. The output stage 424 is configured to amplify the signal to a level suitable for downstream elements, such as to drive an optic signal generator. The output stage 424 may comprise any type multiple stage distributed amplifier, although in other embodiments or other circuit arrangements may be used. At the front end of the distributed amplifier output stage 424 are emitter follower circuits which improve bandwidth by reducing capacitance and allows for gain peaking, such as for example at high frequencies. The output from the distributed amplifier output stage 424 may be provided to a modulator or a laser, in a direct driver configuration. FIG. 6 provides an example embodiment of a distributed amplifier output stage 424 with emitter follower circuits 422.

Figure 5:
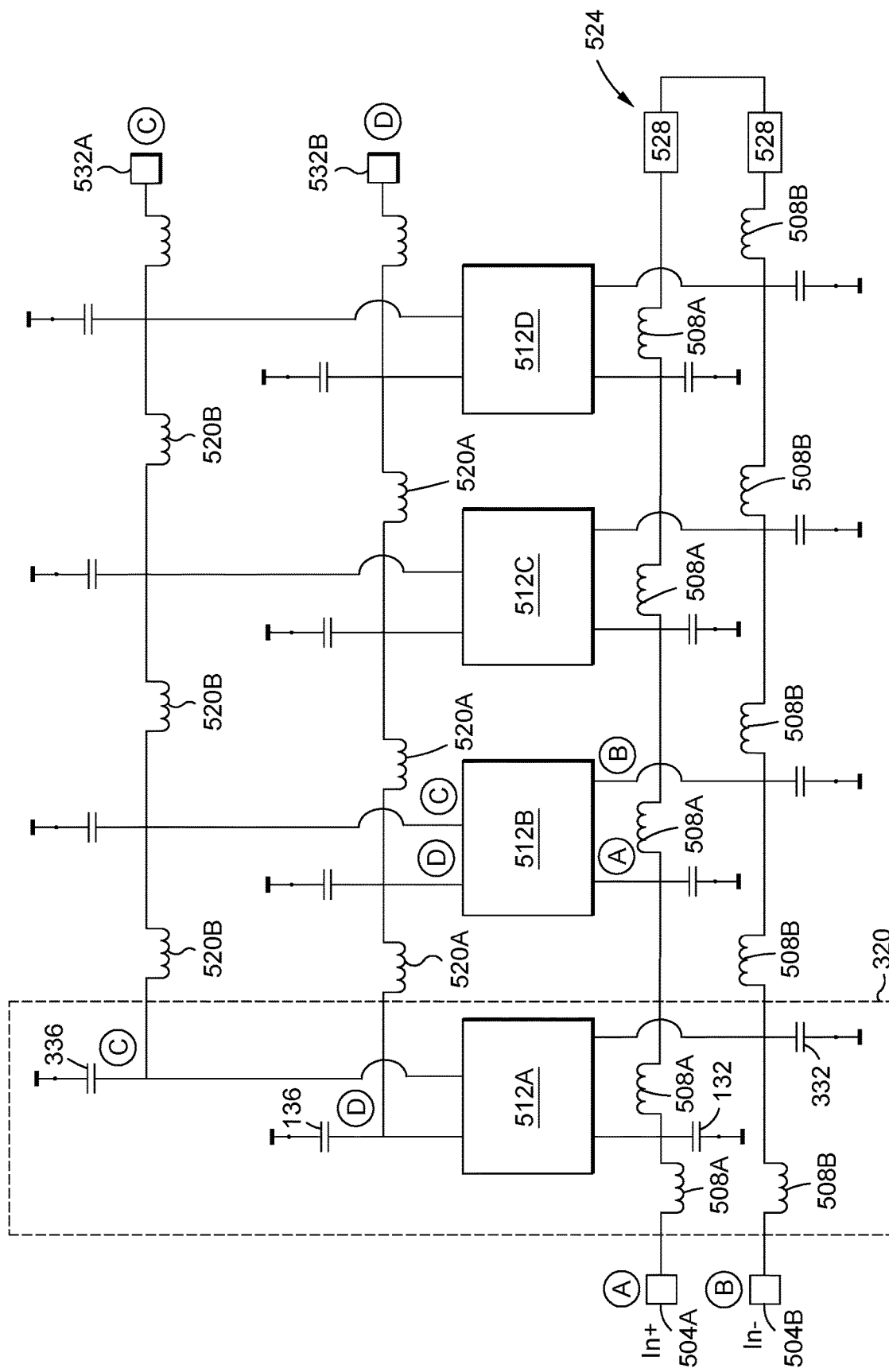
FIG. 5 illustrates a block diagram of an example embodiment of a distributed amplifier output stage.

FIG. 5 illustrates a block diagram of an example embodiment of a distributed amplifier output stage (DAOS) shown as element 424 in FIG. 4. This is but one possible configuration for a DAOS and as such, other embodiments are contemplated. As shown in FIG. 5, the differential inputs 504A, 504B (collectively 504) are provided to inductor elements 508A, 508B. The inductor elements 508A, 508B may comprise any type of device or circuit. This may include inductors, or a transmission line element configured to behave as inductor.

The output of the inductor elements 508A, 508B connect to amplifiers (gain cells) 512A, 512B, 512C, 512D as shown and to subsequent inductor elements 508A, 508B along the input lines. The amplifiers 512A, 512B amplify the signals from the inductor elements 508A, 508B to generate amplified signals suitable for driving a downstream element, such as an optic signal generator or modulator, such as for driving the signal over a transmission line. The amplifiers 512A, 512B, 512C, 512D may comprise any type of amplifier, such as but not limited to, an emitter follower combined with a cascode differential pair. The amplifiers 512 may be configured as shown in FIG. 6 and include the emitter follower circuits.

The input line extends to include additional input line inductor elements 508A, 508B and associated amplifiers 512A, 512B, . . . as shown. Any number of input line inductor elements 508A, 508B and associated amplifiers 512A, 512B, . . . may be provided based on the number of amplification stages. Each of the input line inductor elements 508A, 508B may be the same, such as in length and width, or different sizes/dimensions. In one embodiment, the input line inductor elements 508A, 508B become smaller as the input line progresses. The inductor elements 508A, 508B may be inductors configured as transmission line elements.

Figure 8:
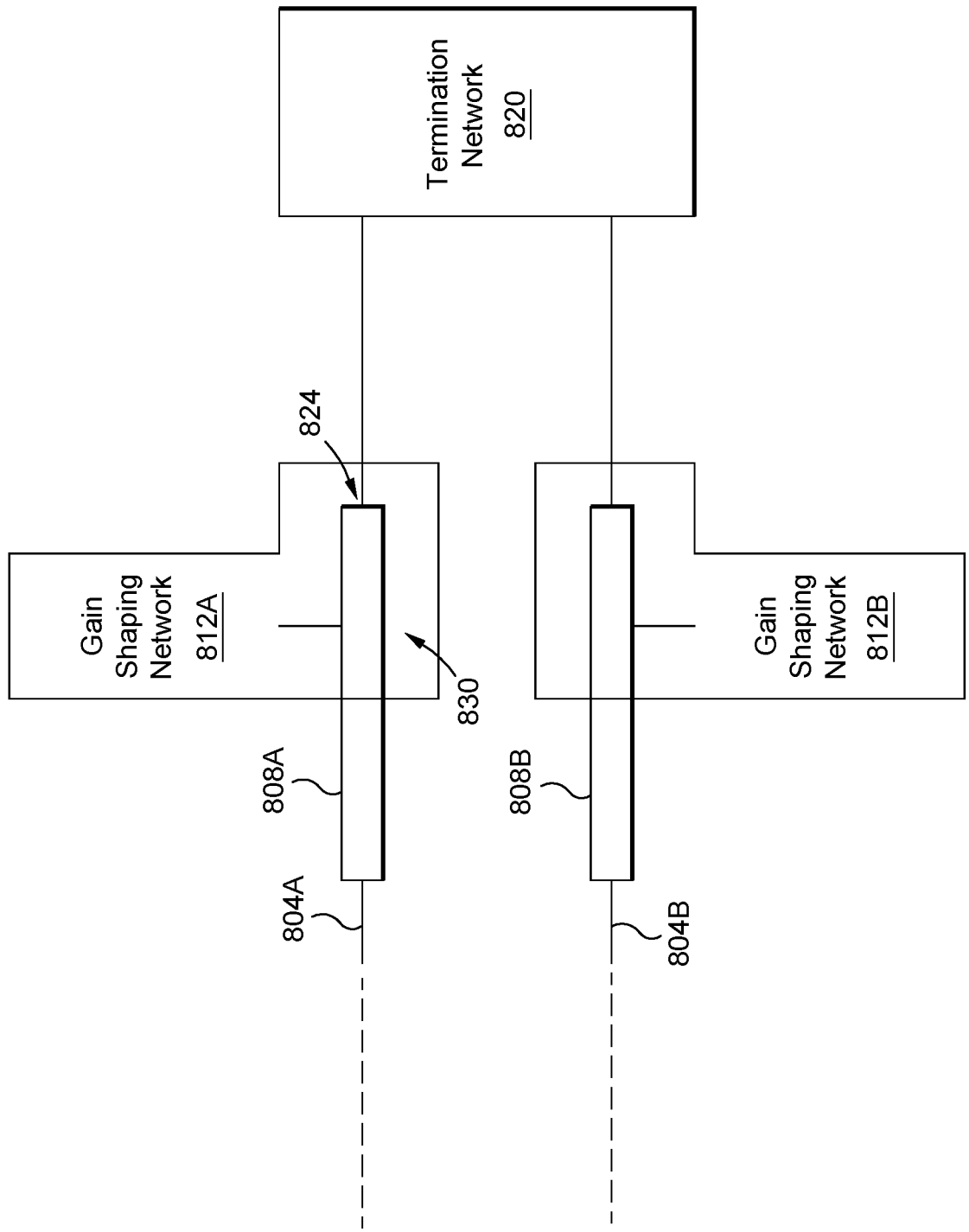
FIG. 8 illustrates a block diagram of an example embodiment of a termination network with gain shaping.
Figure 9:
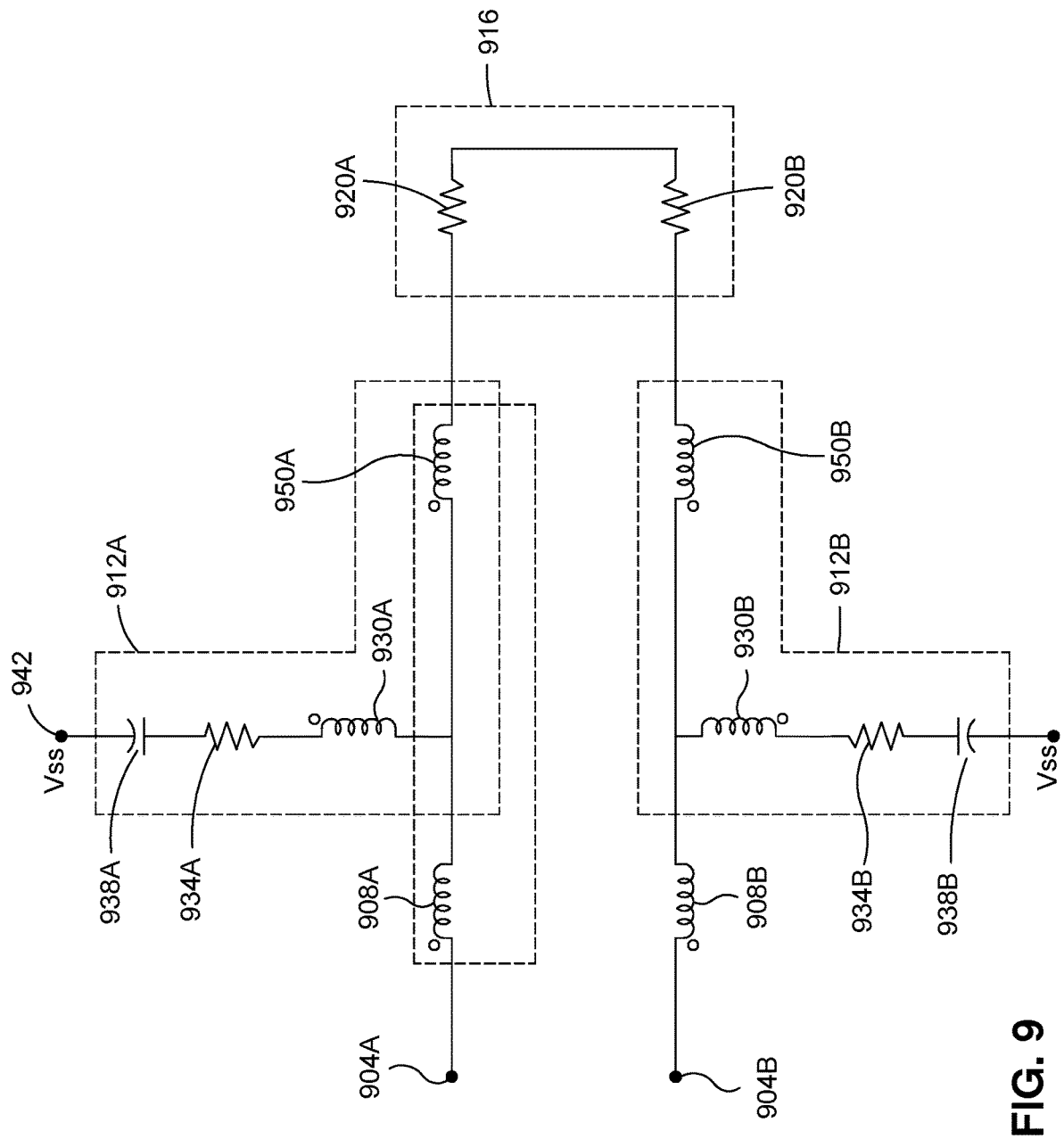
FIG. 9 illustrates an exemplary circuit diagram of a termination network with gain shaping.

At the end of the input line is a termination network 524 including one or more termination elements 528. The termination network 524 is configured to establish and improve gain shaping to counter any frequency based attenuation in the signal, such as in the high frequency range. FIG. 8 and FIG. 9, and the associated description, illustrate exemplary termination networks in greater detail.

The output of the amplifiers 512A, 512B provide the amplified signal to an output line having output line inductor elements 520A, 520B. The output line inductor elements 520A, 520B are configured to cancel capacitances in each amplifier cell 512A, 512B, . . . or any other unwanted capacitance in the distributed amplifier. Any number of output line inductor elements 520A, 520B may be provided based on the number of amplification stages. Each of the output line inductor elements 520A, 520B may be the same, such as in length and width, or different. In one embodiment, the output line inductor elements 520A, 520B become smaller as the output line progresses. Providing multiple amplifier stages 512 distributes the capacitance associated with each amplifier to establish multiple small capacitances along the distributed amplifier. The inductor elements 508, 520 are selected and sided to cancel or counteract the capacitance associated with each amplifier stage.

Figure 1:
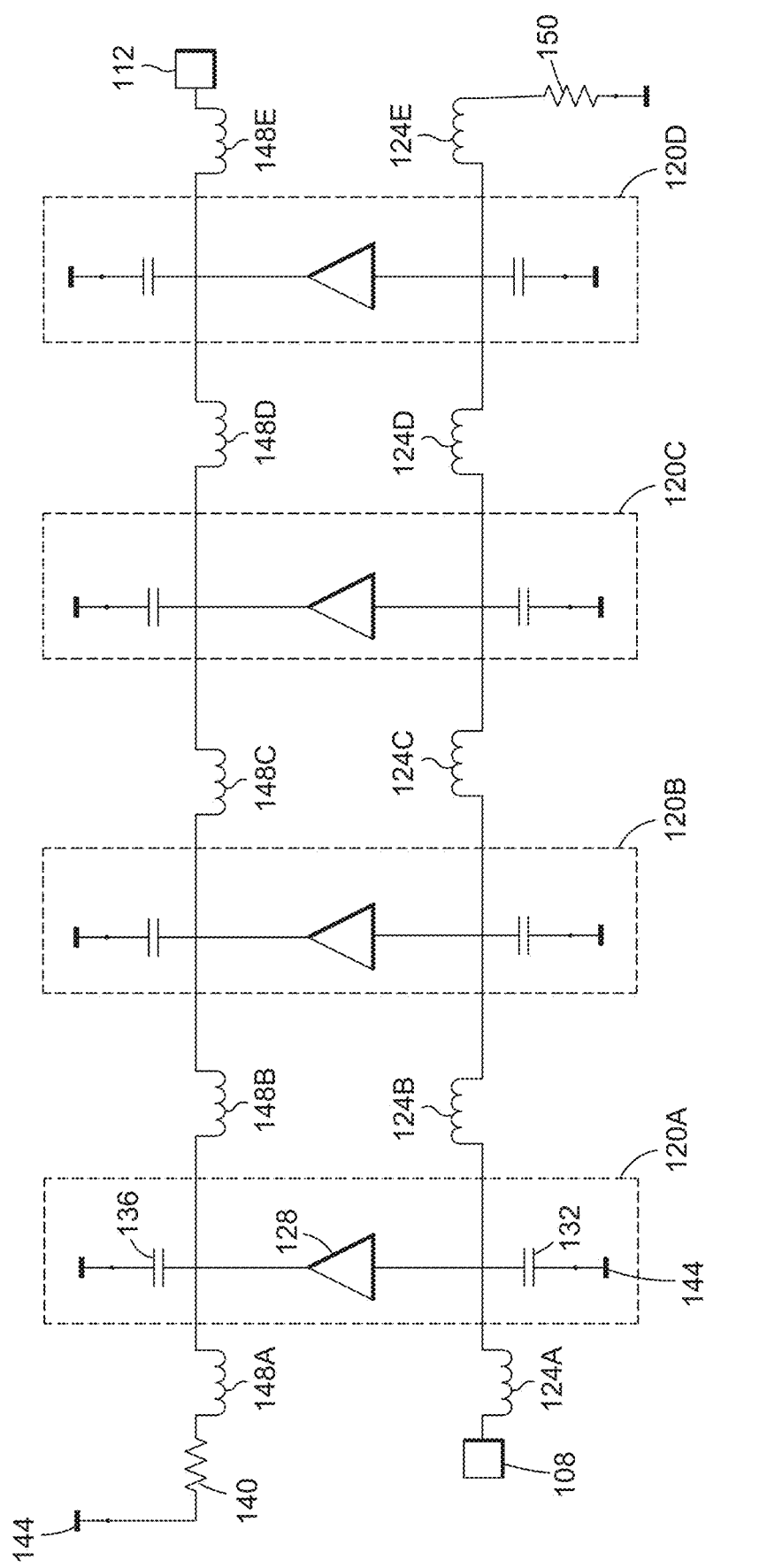
FIG. 1 illustrates a block diagram of an exemplary prior art distributed amplifier.
Figure 2:
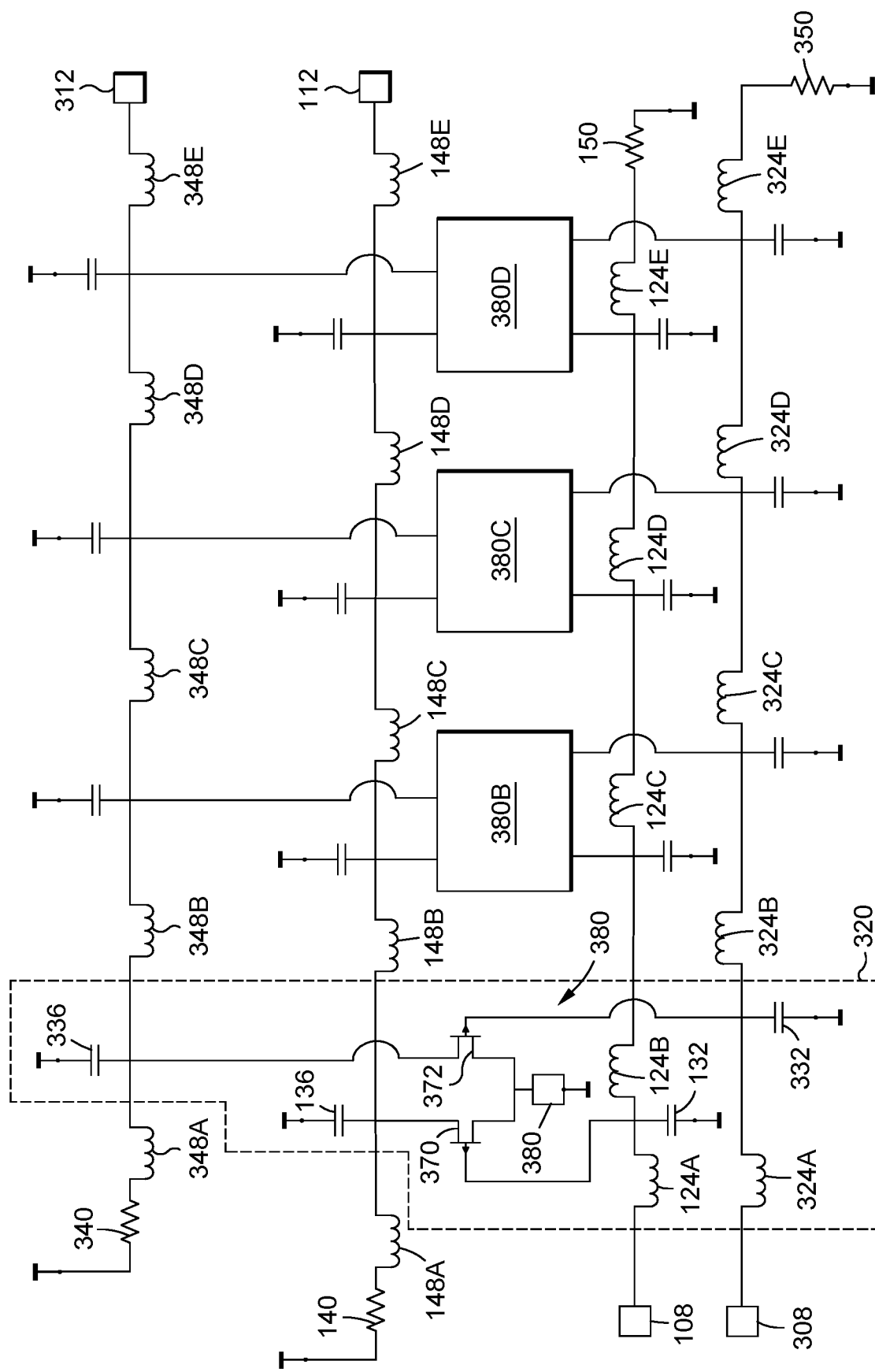
FIG. 2 illustrates an example embodiment of a distributed driver arranged in a differential pair configuration.

The differential signal outputs 532A, 532B are located at the end of each output line as shown to provide the signal to downstream elements. It is contemplated that this embodiment could be implemented in a single ended (non-differential configuration). To aid in understanding, the letters A, B, C, & D are shown within circles in FIG. 5 to correspond to circuit locations in FIG. 6 to identify related connection points. Also differing from the embodiment of FIG. 2 is the open collector configuration of FIG. 5, which omits the resistors 140, 340 and associated connections as shown in FIG. 2.

FIG. 6 illustrates an exemplary distributed amplifier and emitter follower (EF) stage, as referenced in element 424, 422 of FIG. 4, and as element 512 in FIG. 5. This is but one possible configuration for a distributed amplifier with EF stage and as such, other embodiments are contemplated. As shown in FIG. 6, inputs 604, 606 are configured to receive incoming differential signals from the VGA stage. The input 604, which receives in the In1 signal, connects to a base of a transistor 612A configured as a first emitter follower stage 614. A collector of the transistor 612 connects to a supply voltage, such as VCC 620. The emitter of the transistor 612 connects to a current source 624 which also connects to ground. The current source 624A, 624B is configured to be a tunable current source for gain peaking control purposes.

A second emitter follower 614B is configured generally similar to, or the same as, the first emitter follower 614A and as such is not described in detail. For example, an In2 signal connects to input 606. As can be seen elements 612B, 620B, 624B are provided in a similar or same arrangement.

Between the two emitter follower stages is a cascode differential pair 640. The emitter terminals of transistor 612A connects to a base terminal of transistor 644A. Transistor is arranged as cascoded with transistor 650A such that the collector terminal of transistor 644A connects to the emitter terminal of transistor 650A. The collector terminal of transistor 650A connects to a first output terminal 654A. Also provided are transistors 644B, 650B which are arranged in a similar or same configuration as transistors 644A, 650A to form a cascode differential pair 640. The transistor 650A, 650B are arranged in an open collector output. As a result, in this example embodiment, the collector terminals are not terminated on the chip or integrated circuit, but instead directly connect to a modulator or a subsequent device. This is in contrast to the prior art which provides a termination resistor between the outputs 654A, 654B. Output power is lost in the prior art termination resistor, so the proposed design is more power efficient resulting in better performance.

Also part of, or associated with, the cascode differential pair 640 is a common mode shunt to ground capacitors 660 that is connected between the base terminals of transistors 650A, 650B. The ground shunt 660 is configured to function as a virtual ground to shunt AC signals to ground. To ensure stability during differential mode operation (as is configured), the shunt to ground through each capacitor is established.

Connected to the emitter terminals of transistors 644A, 644B is a degeneration network 664, which in turn connects to a current tail source 668. The degeneration network 664 is configured to allow for control of gain as a function of frequency, such as a DC gain control which in turn improves linearity. The DC gain response or behavior is dominated by the resistor values in the degeneration network 664, while the capacitor in the degeneration network is selected to control AC gain. Other configurations of the degeneration network 664 are contemplated other than the series connected resistors and parallel connected capacitor as shown. In addition, the combination of the capacitor and resistors provide gain peaking such that at higher frequencies the gain goes up, which is preferred. Absent the capacitor, the gain at high frequencies will roll off faster, which will detrimentally affect circuit performance.

Also part of this embodiment are one or more variable current sources 624A, 624B configured to bias the emitter follower stages 614, 616, as well as other associated elements. The variable current sources also assist with or control the gain peaking and/or gain shaping such that increasing the current source output increases gain. The variable current source will receive a control signal input to control its output current. In addition, emitter follower (EF) circuits provide a better impedance looking into the EF circuit than if directly connected to the cascode differential pair 640, which improves impedance matching. The resistors are implemented in HBT (heterojunction bipolar transistor) technology, but also could be implemented in BJT, FET devices, such as silicon (Si), silicon carbide (SiC), silicon germanium (SiGe), aluminum phosphide, aluminum arsenide, gallium arsenide, gallium nitride, indium phosphide, and all families of III-V and II-VI semiconductor materials for structural support, or any other process or material. The outputs 654A, 654B of the differential pair 640 are the outputs of the distributed amplifier 424 in FIG. 4, or the output nodes C & D as shown in FIG. 5 and FIG. 6.

The configuration of FIG. 6 provides a benefit over the prior art by configuring the cascode differential pair 640 with the emitter follower stage 614A, 614B on each side of the differential pair. Unlike the prior art where an emitter follower stage is paired with a VGA, in this embodiment the emitter follower stage is paired with the output gain cell creating a novel combination. This configuration provides several benefits. One such benefit is that this arrangement improves bandwidth because looking into the first device, there is a series capacitance which may appear as two capacitances in series. As a result, the overall capacitance is reduced by placing the emitter follower stage in the distributed output stage instead of the VGA, which in turn increases bandwidth. An additional benefit of this configuration is the added flexibility to tune the gain peaking to a higher frequency than would otherwise be difficult in a prior art configuration. Gain peaking is tuned by adjusting the current output of the variable current sources 624B.

In operation, the circuit of FIG. 6 is configured such that the emitter follower circuits are used as gain peaking elements that establish an increase in gain or a decrease in gain at particular frequencies, such as for example, higher frequencies. The amount of gain peaking is controlled by the variable current source 624B. A control signal, from or controlled by a current mirror, is provided to the variable current source to control its current. The control signal may be provided by a digital circuit/signal based on a reference current or some other control values. The value of the control signal may be set by the user with a digital interface, by an analog signal, or feedback. In one embodiment, the DC voltage at each stage may be for example, 2.2 volts and/or 1.3 volts. The emitter follower circuits are also used for impedance matching. The gain peaking control improves bandwidth.

The emitter follower circuits also present a better impedance than looking into the cascode differential pair, particularly as to capacitance. The capacitance will be less than if looking directly into the cascode differential pair, which in turn provides increased bandwidth.

Figure 7:
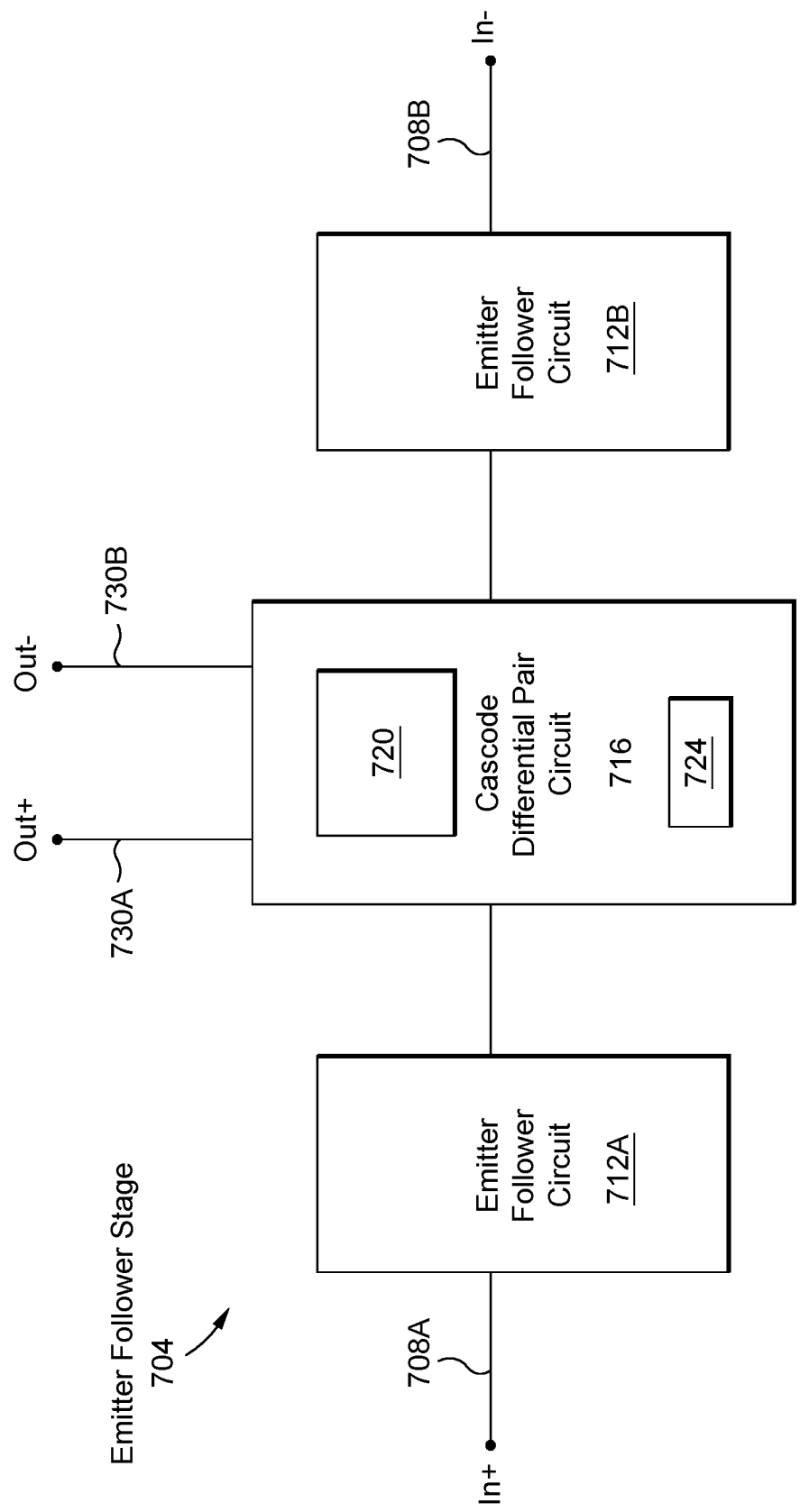
FIG. 7 illustrates a block diagram of the exemplary amplifier circuit.

FIG. 7 illustrates a block diagram of the exemplary amplifier circuit shown in FIG. 6 and as would correspond to the amplifier output stage 424 of FIG. 4. In this simplified block diagram, inputs 708A, 708B are configured to receive a differential input signal. The input signals are provided to emitter follower circuits 712A, 712B which are configured to transform or match the impedance between the proceeding and subsequent elements or stages and provide for gain shaping/peaking. The output of the emitter follower circuits 712A, 712B feed into an amplifier 716, which in this embodiment is a cascode differential pair circuit. In other embodiments, other types of amplifier circuits may be used including, but not limited to, a single ended amplifier, differential pair, or a differential cascode amplifier with RC degeneration. Stated another way, given the following elements: 1) Differential amplifier, 2) cascode differential pair, and 3) RC degeneration, the contemplated combination could be elements 1 or elements 1+3 or elements 1+2, or single ended configuration such that only one signal output is used (which avoids the use of element 712B. The amplifier 716 is configured to amplify the receive signals and generate a differential signal output on outputs 730A, 730B. In this embodiment, the amplifier 716 includes a degeneration network 724 and a virtual ground node circuit 720, as are described above in connection with FIG. 6.

FIG. 8 illustrates a block diagram of an example embodiment of a termination network with gain shaping. This is but one possible example embodiment and as such, other embodiments are contemplated. In this embodiment, the transmission line 804A, 804B, as shown in FIG. 5, include an impedance matching element 808A, 808B. A gain shaping network 812A, 812B connects to the impedance matching elements (transmission line inductor) 808A, 808B via the conductive path. The impedance matching networks 804A, 804B also connects to a termination network 820. In some embodiments, the matching network elements 804A, 804B may be considered as part of the gain shaping network 812A, 812B or work in connection with the gain shaping network such that the values of all the elements may be adjusted to achieve the desired gain shaping.

In this embodiment, the gain shaping network connects not at an end terminal 824 of the impedance matching networks 804A, but instead at location 830 that is between the input and output 824 of the impedance matching networks 804A. This provides the benefit of improved gain shaping. By moving the connection point 830 or tap in point along the impedance matching element 808A, the gain shaping can be adjusted for frequency, intensity, or both. This can be used to establish a more linear frequency response or supplement gain at frequencies which may otherwise be attenuated. The gain shaping network 812A, 812B may comprise any combination of resistors, inductors, and/or capacitors arranged to gain shape. The termination network may comprise active or passive elements, such as resistors, capacitors, or inductors configured to control as power consumption, maximum operating frequency, and input and output impedance. The resistance typically ranges from 20 ohms to 100 ohms but are driven and determined by system requirements. In one embodiment, the impedance matching element 808A, 808B is an inductor(s), which may be configured as an integrated transmission line element.

FIG. 9 illustrates an exemplary circuit diagram of a termination network with gain shaping. This is but one possible example embodiment and as such other embodiments are contemplated. In this embodiment, the transmission line 904A, 904B, as shown in FIG. 5, include an impedance matching element 908A, 908B. A gain shaping network 912A, 912B connects to the impedance matching elements 908A, 908B via the transmission line conductive path. The impedance matching networks 912A, 912B also connect to a termination network 916, that comprises one or more termination resistors 920A, 920B configured to provide a termination resistance and for impedance matching/balancing. The inductor 930A, 930B may connect to the midpoint or at any point between the start and end of the transmission line inductors 950A, 950B such as shown in FIG. 8. The connection may occur between the inductor end terminals.

In this example embodiment, the gain shaping network comprises an inductor 930A in series with a resistor 934A in series with a capacitor 938A. The capacitor connects to a ground node Vss 942. Selection of the values for the inductor 930A, resistor 934A, and capacitor 938A control the frequency affected by the gain shaping and its magnitude. The gain shaping overcomes the challenges associated with optical network modulator, which has a gain profile that dips at certain frequencies, typically high frequencies. Using the gain shaping associated with the termination network can be used to increase the gain at the frequencies that are otherwise attenuated by the optical network modulator.

FIG. 10 illustrates a block diagram of an example embodiment of a variable gain amplifier (VGA). This is but one possible embodiment and as such, other configurations are possible. In this embodiment of the VGA 1004, inputs 1008A, 1008B are configured to receive the differential signal as inputs. The inputs 1008A, 1008B connect to a cascode VGA 1012. The cascode VGA is configured to amplify the received signal.

The output of the cascode VGA 1012 connects to gain peaking control elements 1016 to adjust or control gain peaking. As discussed herein, gain peaking is beneficial to provide additional gain for specific frequencies, which may otherwise be attenuated by the system or channel. The gain peaking control elements 1016 may comprise any type elements or structure configured to increase or decrease gain in one or more frequency bands. The output of the gain peaking control elements 1016 connect to a termination load 1020. The termination load 1020 is configured to set the gain of the VGA and to provide matching with the output stage of the distributed amplifier. In one embodiment, the termination load comprises a combination of resistors and inductors selected to increase gain at a high frequency.

The termination load 1020 is biased from a bias signal source 1024, which may be any bias signal source, such as one or more bias circuits, configured to bias the VGA system 1004. The termination load 1020 also connects to output path gain peaking elements 1030. The output path gain peaking elements 1030 may comprise active elements, passive elements, or a combination of both active and passive elements configured to establish or control gain and certain frequencies.

The outputs 1044A, 1044B are on the opposing side of the output path gain peaking elements 1030 as shown and are configured to output the differential signal. The outputs 1044A, 1044B of the VGA 1004 may connect to the distributed amplifier output stage.

Also shown in FIG. 10 is a second bias source 1038 configured to provide a bias signal to the VGA 1004 as shown. The second bias source 1038 connects to a degeneration network 1034, which in turn connects to the cascode VGA 1012. The degeneration network 1034 may comprise one or more active elements, passive elements, or a combination of active and passive elements. The degeneration network 1034 is configured to control or adjust low frequency gain, such as a DC gain control which in turn improves linearity.

FIG. 11 illustrates a circuit diagram of an example embodiment of a variable gain amplifier (VGA) as shown by element 420 in FIG. 4. This is but one possible circuit level configuration and one of ordinary skill in the art may develop other embodiments which do not depart from the claims. In this embodiment, at the bottom of FIG. 11 is a bias signal input 1108 which is provided to a common mode rejection element 1112, which in this embodiment is an inductor. The bias signal may be provided by a current source (not shown) or any other type of bias signal source. The benefit gained through use of the common mode rejection elements 1112 rejects the common mode signal. When the signal on the + and − inputs are in phase, the common mode rejection elements 1112 will reject those common mode signal components. Common mode signal components can appear from noise in the signal or noise in the supply voltage.

An additional bias signal node 1116 is provided at the top of the circuit shown in FIG. 11. The bias signal node 1116 connects a voltage regulator to obtain a bias voltage and to termination resistors 1120A, 1120B. Instead of the open collector configuration as shown in FIG. 6, this embodiment includes termination resistors 1120A, 1120B, which may also be referred to as load or load resistors. The termination resistors 1120A, 1120B are configured to set the gain of the VGA and to provide matching with the output stage.

On the opposing terminals of the resistors 1120A, 1120B are the output paths 1128A, 1128B which connect to output node peaking control elements 1124A, 1124B. In addition, peaking control elements 1132 are provided as being attached to the termination resistors 1120A, 1120B as shown.

The peaking control elements 1124A, 1124B, 1132 may comprise inductors configured and selected to provide peaking (gain) at frequencies. The value of the peaking control elements 1124A, 1124B, 1132 are selected to control the amount of peaking (magnitude) and the frequency or frequency range at which peaking occurs. In one embodiment, the peaking control elements 1124A, 1124B, 1132 comprise inductors but in other embodiments, other elements, passive, active, or a combination of both, may be used.

Shown in dashed lined boxes are the gain control elements 1180 that is configured to control the gain of the VGA. In addition, the termination load 1184A, 1184B are configured as described above.

Also shown in FIG. 11 is a cascode amplifier stage with a differential pair that includes differential pair transistors 1140A, 1140B which have a collector terminal connected to the peaking control elements 1132 as shown. The base terminals of the differential pair transistors 1140A, 1140B are connected as shown. A Vcontrol signal is provided to one set of base terminals as shown such that the Vcontrol signal controls gain. The other base terminals of differential pair transistors 1140A, 1140B are connected to shunt capacitors 1170 as shown to provide a common rail for symmetrical configuration. Connected to the emitter terminals of the differential pair transistors 1140A, 1140B are cascode connected transistors 1144A, 1144B as shown to provide additional amplification. The input signals In+, In− is provided to input terminals 1160A, 1160B, which are the base terminals of transistors 1144A, 1144B.

A degeneration network 1150 connects in parallel with resistors 1158A, 1158B to a collector terminal of the transistors 1144A, 1144B as shown. In this embodiment, the degeneration network 1150 includes capacitors 1154 and optionally the resistors 1158A, 1158B. The degeneration network 1150 is configured to control or adjust low frequency gain, such as a DC gain control which in turn improves linearity. The DC gain response or behavior is dominated by the resistor values 1158A, 1158B, while the capacitor 1154 in the degeneration network 1150 is selected to control AC gain. Other configurations of the degeneration network 1150 are contemplated other than as shown. In addition, the combination of the capacitor and resistor value may be selected to provide gain peaking such that at higher frequencies the gain goes up, which is preferred. Absent the capacitors 1154, the gain at high frequencies will roll off faster.

The configuration of FIG. 11 provides benefits over the prior art. The terminated output (termination resistors/load) in combination with the peaking elements provide improved impedance matching between the VGA and the subsequent distributed amplifier. The improved impedance matching resulting in greater power transfer and reduces reflections.

Figure 12A:
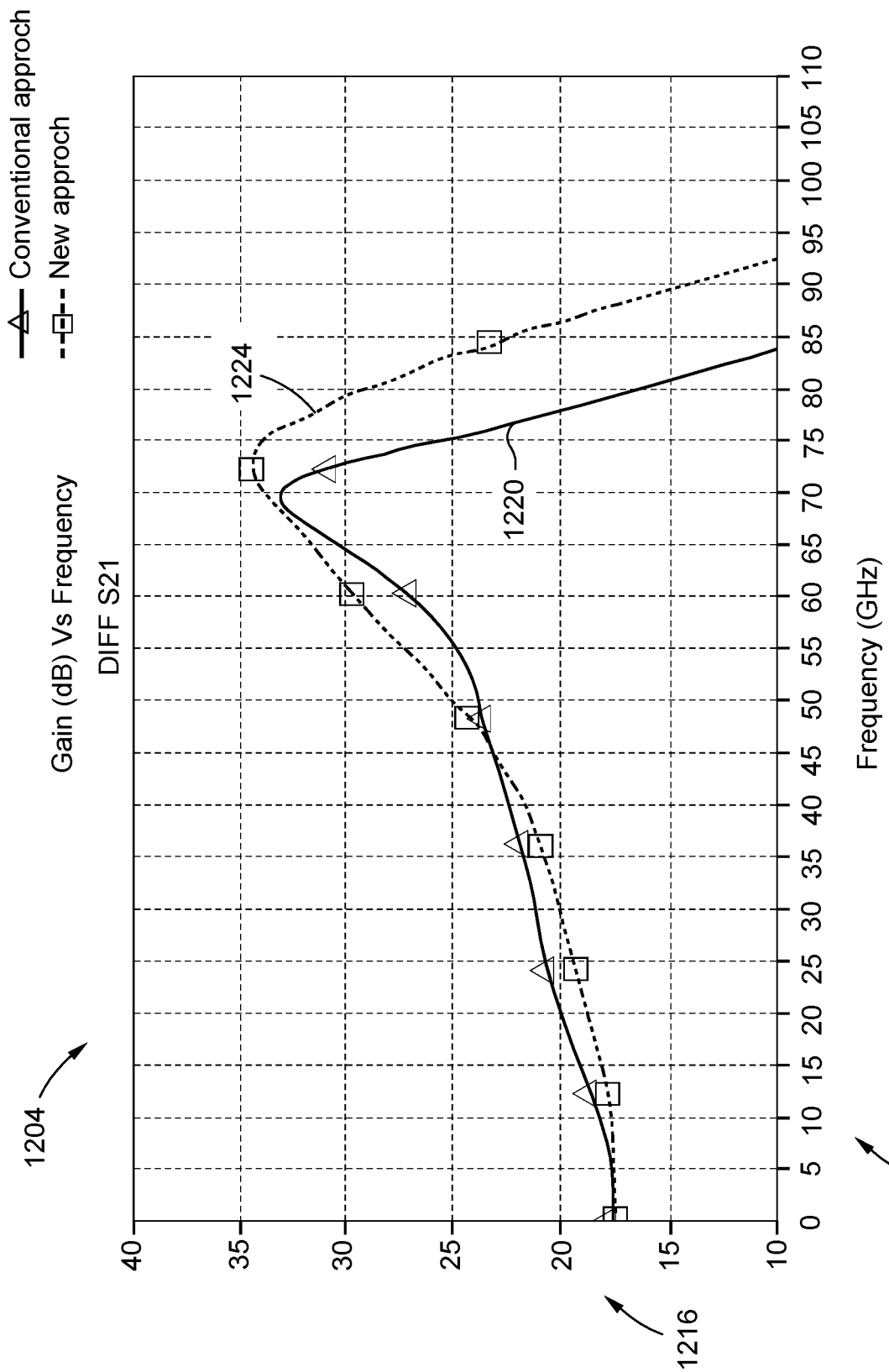
FIG. 12A and FIG. 12B illustrate exemplary signal plots showing the improvements of the disclosed system over prior art designs.
Figure 12B:
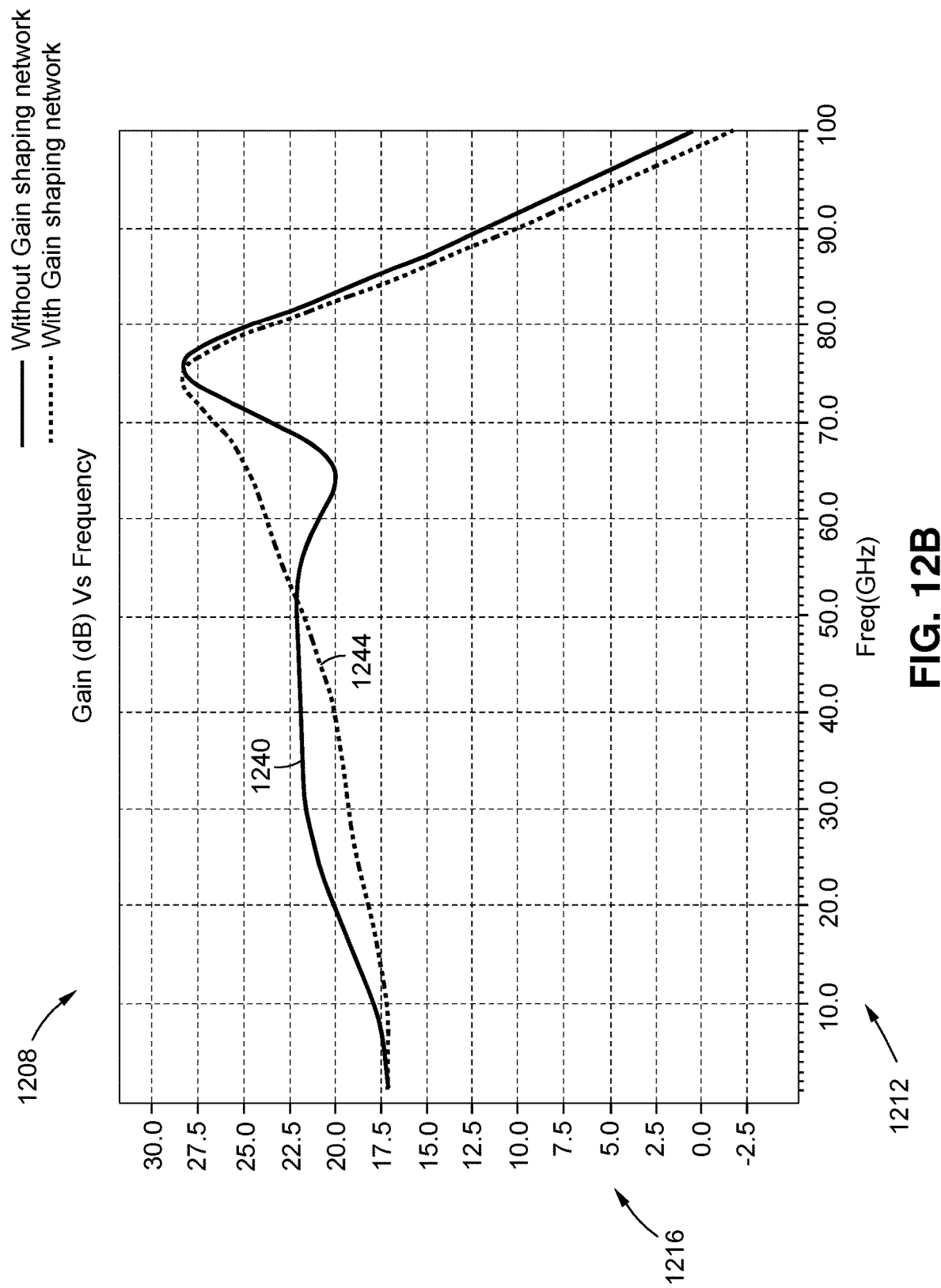

FIG. 12A and FIG. 12B illustrate exemplary signal plots showing the improvements of the disclosed system over prior art designs. FIG. 12A shows improved bandwidth and gain peaking due to the innovation disclosed herein. As shown in FIG. 12A signal, plots 1208 are shown with frequency on the horizontal axis 1212 and gain, in dB, on the vertical axis 1216. The prior art gain plot 1220 shows a drop in gain in the 50 to 65 GHz frequency range as compared to the current system signal plot 1224. The current system signal plot 1224 also exhibits higher gain at higher frequencies than the prior art plot 1220.

FIG. 12B shows gain shaping due to the innovation disclosed herein. As shown in FIG. 12B signal, plots 1208 are shown with frequency on the horizontal axis 1212 and gain, in dB, on the vertical axis 1216. The prior art signal plot 1240 is shows with a drop in gain in the 60 to 70 GHz frequency range. Using the gain shaping disclosed herein, the gain in shaped in the frequency region to create a more linear gain function as shown in signal plot 1244. The current system signal plot 1244 also exhibits lower gain in the 10 to 50 GHz frequency range as compared to the prior art signal plot 1240, further increasing linearly.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A distributed amplifier with variable gain control stage comprising:
   a variable gain amplifier comprising:
      a signal input configured to receive a data signal;
      a gain control input configured to receive a gain control signal;
      a gain controlled amplifier configured to receive the data signal and the gain control signal to create a gain adjusted signal, such that an amount gain adjustment is determined by the gain control signal;
      one or more gain peaking control elements, connected to the gain controlled amplifier, configured to establish gain peaking in the gain adjusted signal; and
      an output configured to provide the gain adjusted signal from the one or more gain peaking control elements to the distributed amplifier;
   two or more amplifier cells, each amplifier cell comprising:
      an amplifier cell input configured to receive the gain adjusted signal;
      two or more amplifiers, connected in a cascode configuration, to amplify the gain adjusted signal to create an amplified signal; and
      an amplifier cell output configured to carry the amplified signal;
   an input path configured to receive an input signal and distribute the input signal to the two or more amplifier cells, the input path including one or more inductors that cancel input parasitic capacitance from the two or more amplifier cells; and
   an output path connected to the amplifier cell output of the two or more amplifier cells to receive the amplified signal, the output path including one or more inductors that cancel output parasitic capacitance from the two or more amplifier cells.

2. The distributed amplifier of claim 1 wherein the one or more gain peaking control elements comprise inductors.

3. The distributed amplifier of claim 1 further comprising one or more emitter follower circuits having an emitter follower input connected to the input path and an emitter follower output connected to the amplifier cell input, the one or more emitter follower circuits configured to perform frequency specific gain adjustment in the amplified signal created by the one or more amplifier cells.

4. The distributed driver of claim 1 wherein an inductor from the input path and an inductor from the output path are associated with each amplifier cell.

5. The distributed driver of claim 1 further comprising a degeneration network connected to the gain controlled amplifier, the degeneration network configured to adjust low frequency gain.

6. The distributed driver of claim 1 wherein the variable gain amplifier further comprises one or more termination resistors configured to establish the gain of the gain controlled amplifier and set the output impedance of the variable gain amplifier.

7. The distributed driver of claim 1 wherein the two or more amplifier cells are configured in an open collector configuration.

8. The distributed driver of claim 3 wherein the emitter follower circuit further comprises a variable current source configured to control the frequency specific gain adjustment.

9. A distributed amplifier with variable gain control comprising:
   a gain control circuit comprising a gain control circuit input, a gain control circuit output, one or more gain control amplifiers, and one or more gain peaking control elements located between a variable gain amplifier and an output, such that an amount gain adjustment is determined by a gain control signal which is received on a gain control signal input of the gain control circuit and the gain control circuit generating a gain adjusted signal; and
   the distributed amplifier comprising:
      an input path configured to receive an input signal including the gain adjusted signal and distribute the input signal to two or more amplifier cells, the input path including one or more inductors that cancel input parasitic capacitance from the two or more amplifier cells;

two or more amplifier cells configured with amplifiers in a cascode configuration to amplify a received signal to create an amplified signal;

an output path connected to the amplifier cell output of the two or more amplifier cells to receive the amplified signal, the output path including one or more inductors that cancel output parasitic capacitance from the two or more amplifier cells.

10. The distributed amplifier of claim 9 wherein gain peaking control elements comprise inductors.

11. The distributed amplifier of claim 9 further comprising a termination load connected between the gain peaking control elements and the gain control circuit output.

12. The distributed amplifier of claim 9 further comprising one or more emitter follower circuits, associated with each amplifier cell, that are located between the input path and the two or more amplifier cells, wherein the emitter follower circuits are configured to perform frequency specific gain adjustment in the amplified signal.

13. The distributed driver of claim 12 wherein the emitter follower circuit further comprises a variable current source configured to control the frequency specific gain adjustment.

14. The distributed amplifier of claim 9 wherein the gain control circuit further comprises a degeneration network connected to the gain control amplifier, the degeneration network configured to adjust low frequency gain.

15. The distributed driver of claim 1 wherein the two or more amplifier cells are configured in an open collector configuration.

16. A method for creating an amplified signal with frequency specific magnitude adjustment comprising:

receiving the input signal, an input signal to be transmitted on an optic fiber as an optic signal;

adjusting gain applied to the input signal with a variable gain amplifier, based on a control gain signal, to create a gain adjusted signal, such that adjusting of the gain includes introducing frequency specific magnitude adjustment to the input signal for gain peaking, gain shaping, or both;

receiving the gain adjusted signal on an amplifier input path, the amplifier input path having an inductance that cancels input parasitic capacitance of two or more amplifier cells;

amplifying the input signal after frequency specific magnitude adjustment with the two or more amplifier cells;

combining the amplified output signals from the two or more amplifier cells on an output path as a combined output signal, the output path having an inductance that cancels output parasitic capacitance of the two or more amplifier cells; and presenting the combined output signal on an output.

17. The method of claim 16 wherein an inductor from the input path and an inductor from the output path are associated with each amplifier cell, and the inductors are realized as integrated transmission line elements.

18. The method of claim 16 wherein the two or more amplifier cells are configured in an open collector configuration.

19. The method of claim 16 further introducing frequency specific gain control with an emitter follower circuit that is associated with at least one of the two or more amplifier cells, the emitter follower circuit including a variable current source configured to control an amount of frequency specific gain control.

20. The method of claim 16 wherein the two or more amplifier cells further comprise a first input and a second input, the first and second inputs are configured to accept a differential signal, and the first input connects to a first emitter follower circuit and the second input connects to a second emitter follower circuit.

* * * * *

UNITED STATES PATENT AND TRADEMARK OFFICE
CERTIFICATE OF CORRECTION

PATENT NO. : 12,395,130 B2
APPLICATION NO. : 18/089484
DATED : August 19, 2025
INVENTOR(S) : Nguyen Nguyen et al.

Page 1 of 1

It is certified that error appears in the above-identified patent and that said Letters Patent is hereby corrected as shown below:

In the Claims

Column 21, Claim 16, Line 32, please delete "receiving the input signal, an input signal to be" and insert -- receiving an input signal, the input signal to be --, therefore.

Signed and Sealed this
Sixteenth Day of September, 2025

Coke Morgan Stewart
*Acting Director of the United States Patent and Trademark Office*